(12) United States Patent
Olsson et al.

(10) Patent No.: US 10,171,712 B2
(45) Date of Patent: Jan. 1, 2019

(54) THERMAL EXTRACTION ARCHITECTURES FOR CAMERA AND LIGHTING DEVICES

(71) Applicants: Mark S. Olsson, La Jolla, CA (US); Eric M. Chapman, Santee, CA (US); Nicholas A. Smith, Chula Vista, CA (US); James F. Kleyn, Santee, CA (US); Alexander L. Warren, San Diego, CA (US)

(72) Inventors: Mark S. Olsson, La Jolla, CA (US); Eric M. Chapman, Santee, CA (US); Nicholas A. Smith, Chula Vista, CA (US); James F. Kleyn, Santee, CA (US); Alexander L. Warren, San Diego, CA (US)

(73) Assignee: SEESCAN, INC., San Diego, CA (US)

( * ) Notice: Subject to any disclaimer, the term of this patent is extended or adjusted under 35 U.S.C. 154(b) by 128 days.

(21) Appl. No.: 14/746,590

(22) Filed: Jun. 22, 2015

(65) Prior Publication Data
US 2016/0373619 A1 Dec. 22, 2016
US 2018/0316829 A9 Nov. 1, 2018

Related U.S. Application Data

(63) Continuation of application No. 13/775,066, filed on Feb. 22, 2013, now Pat. No. 9,066,446.

(60) Provisional application No. 61/602,063, filed on Feb. 22, 2012.

(51) Int. Cl.
| | |
|---|---|
| *H04N 5/225* | (2006.01) |
| *H05K 1/02* | (2006.01) |
| *H04N 5/232* | (2006.01) |

(52) U.S. Cl.
CPC ......... *H04N 5/2252* (2013.01); *H04N 5/2256* (2013.01); *H04N 5/2257* (2013.01); *H04N 5/23203* (2013.01); *H05K 1/0201* (2013.01); *H05K 1/0207* (2013.01); *H04N 2005/2255* (2013.01); *H05K 1/0209* (2013.01); *H05K 2201/09027* (2013.01); *H05K 2201/10151* (2013.01)

(58) Field of Classification Search
CPC ............... H04N 5/2252; H04N 5/2257; H04N 5/23203; H04N 5/2256; H04N 2005/2255; H05K 1/0201; H05K 1/0207; H05K 1/0209; H05K 2201/09027; H01L 2924/181; A61B 1/128
See application file for complete search history.

(56) References Cited

U.S. PATENT DOCUMENTS

| | | | | |
|---|---|---|---|---|
| 2003/0080392 A1* | 5/2003 | Zuniga-Ortiz | ...... | H01L 23/3128 257/503 |
| 2006/0056049 A1* | 3/2006 | Tokiwa | ................... | G02B 13/16 359/684 |
| 2008/0158349 A1* | 7/2008 | Miller | ................ | A61B 1/00052 348/82 |
| 2012/0035418 A1* | 2/2012 | Talbert | ............... | A61B 1/00016 600/109 |
| 2014/0063794 A1* | 3/2014 | Parekh | ...................... | F21S 8/04 362/185 |

(Continued)

*Primary Examiner* — Neil R Mikeska
(74) *Attorney, Agent, or Firm* — Steven C. Tietsworth, Esq.

(57) ABSTRACT

Thermal extraction architectures for heat-generating electronic devices such as digital cameras or lights are disclosed.

16 Claims, 26 Drawing Sheets

(56) References Cited

U.S. PATENT DOCUMENTS

| | | | | |
|---|---|---|---|---|
| 2014/0262161 A1* | 9/2014 | Weigand | ............... | G06F 1/203 |
| | | | | 165/104.33 |
| 2015/0049243 A1* | 2/2015 | Samuels | ............. | G03B 17/568 |
| | | | | 348/374 |
| 2016/0127618 A1* | 5/2016 | Bart | .................... | H04N 5/2252 |
| | | | | 348/373 |
| 2017/0064159 A1* | 3/2017 | Lee | ..................... | H04N 5/2252 |

* cited by examiner

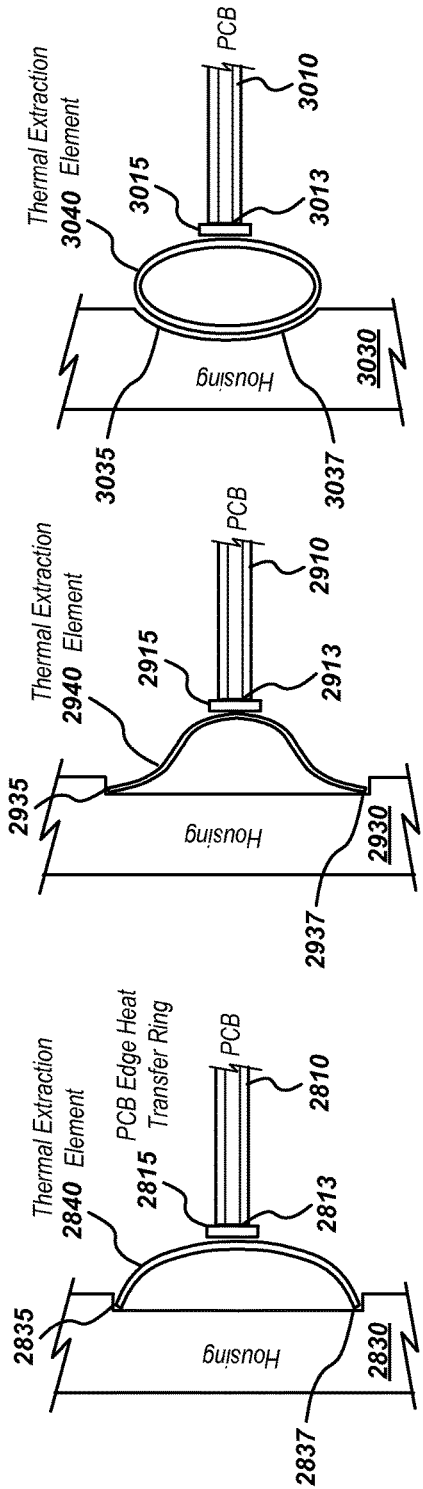
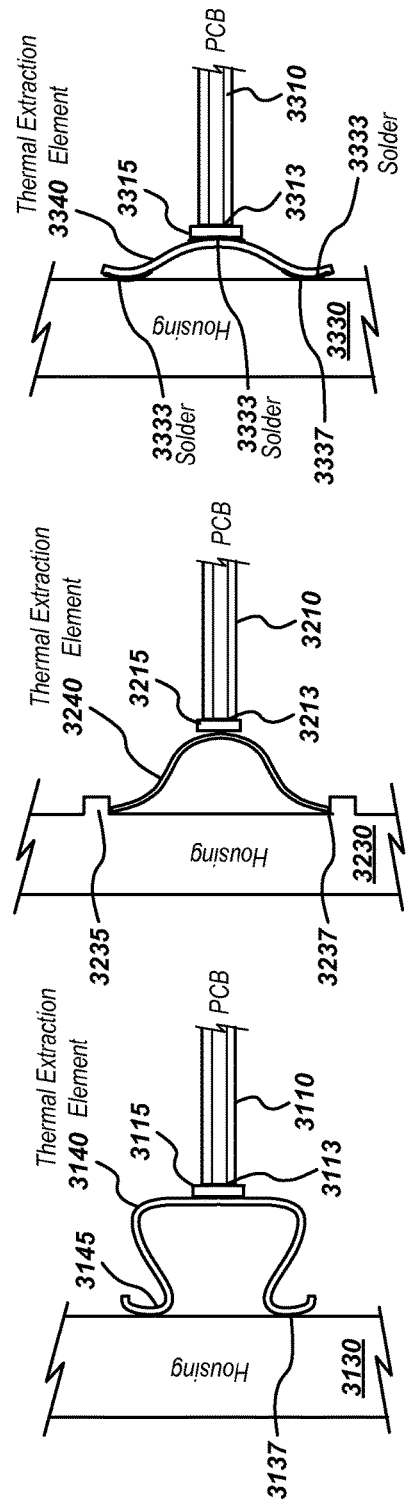

Example Lighting Device Embodiment with
Thermal Extraction Architecture

THERMAL EXTRACTION ARCHITECTURES FOR CAMERA AND LIGHTING DEVICES

CROSS-REFERENCE TO RELATED APPLICATIONS

This application is a continuation of and claims priority to co-pending U.S. patent application Ser. No. 13/775,066, filed Feb. 22, 2013, entitled THERMAL EXTRACTION ARCHITECTURE FOR CAMERA HEADS, INSPECTION SYSTEMS, AND OTHER DEVICES AND SYSTEMS, which claims priority under 35 U.S.C. § 119(e) to United States Provisional Patent Application Ser. No. 61/602,063, filed Feb. 22, 2012, entitled THERMAL EXTRACTION ARCHITECTURE CAMERA HEADS & INSPECTION SYSTEMS. The content of each of these applications is hereby incorporated by reference herein in its entirety for all purposes.

FIELD

This disclosure relates generally to devices and systems with heat sensitive components such as camera heads, lights, or other electronics with heat-generating components. More specifically, but not exclusively, the disclosure is directed to camera heads or lighting devices that include thermal extraction elements configured to extract heat from heat sensitive devices and transfer the heat to a housing to improve performance, reliability, and/or life expectancy.

BACKGROUND

The potential for overheating is a known issue within many known devices and systems. For instance, camera head components such as digital imaging sensors that generate heat or are subject to significant heat exposure from other components during operation can be damaged or destroyed, as can other components. This may be particularly true for camera heads where the camera is enclosed, such as where a camera's particular use requires a compact and/or largely air or water tight package, such as in a pipe inspection camera. Enclosed lights or other electronic devices may be subject to similar heating problems.

During operation, continuous use of these camera heads, such as those used in video inspection systems, may cause components to heat up over time and exceed heat limitation specifications required or recommended by the camera's manufacturer. In such cases, heating may cause various problems. For example, the inability to extract heat from sensitive components may cause overheating and in turn create noise on the captured images and video, may damage internal components, may shorten the lifespan of the camera, may void manufacturer warranties, and/or may cause other problems.

Accordingly, there is a need for improved camera heads and other heat sensitive systems and devices configured to effectively extract heat away from heat sensitive components, as well as provide other potential advantages in camera systems or other devices or systems where heating occurs.

SUMMARY

In accordance with various aspects, a camera head with a thermal extraction architecture configuration may include a housing or mounting assembly or other component including a thermal contact area, a printed circuit board (PCB), and a thermal extraction (also denoted herein as "extracting") element disposed between the PCB and housing to transfer heat from the PCB to the housing and external environment.

The PCB may contain a series of thermal extracting, electrical connecting, and/or insulating layers. The thermal extracting layer or layers and/or electrical connecting layer or layers may alternate with insulating layers between each, such that the thermal extracting layers never directly come in contact with the electrical connecting layers. The sides or other areas or surfaces of the thermal extraction PCB may be configured to allow the thermal extraction piece or element to make contact with the thermal extracting layer or layers to conduct heat away from the PCB, such as at the contact areas. In turn, the thermal extracting piece or element may contact the housing or assembly to conduct heat from the PCB to the housing or assembly. A reduction of thermal resistance to heat sensitive components on the specialized PCB may be achieved whereby heat may be channeled away from sensitive components through the thermal extracting layers, through the thermal extraction element, and redistributed to the camera head housing or assembly. In some embodiments, the camera head may have several PCBs or a PCB stack where a thermal extraction element may be used for each PCB.

In another aspect, a thermally conductive shoe or ring may be secured along the edge of a thermal extracting PCB, such as by solder. The thermally conductive shoe may contact a thermal extraction element that further redistributes heat away from sensitive components on the PCB and to the device housing or assembly. In some embodiments a stack of multiple thermal extracting PCBs may be used, in which case each PCB may receive a thermally conductive ring and a single thermal extraction element may encapsulate the stack of thermal extracting PCBs to provide bulk heat transfer. In yet other embodiments where a stack of multiple thermal extracting PCBs may be used, each PCB may receive a thermally conductive shoe as well as an individual thermal extraction element for each thermal extracting PCB.

In another aspect, the camera head may include a lighting element to generate light for illuminating a subject area, for instance using light emitting diodes (LEDs).

In another aspect, a thermal extraction architecture camera head may be configured for use in a camera system or other heat generating device or system. The camera system may be configured for use in a pipe inspection system or other closed area or cavity inspection system.

In another aspect, a thermal extraction PCB may be a rectangular, square, or other non-round shape. Furthermore, the thermal extraction element or elements need not fully encapsulate the sides of the thermal extraction PCB or PCBs. For instance, some embodiments may have one thermal extraction element only along one or two sides of a rectangular thermal extraction PCB.

In another aspect, the thermal extraction architecture described herein in combination with camera heads may also be used in a wide variety of other systems and devices where cooling of internal components is needed or desired. For instance, some LED lighting systems may benefit from cooling of stacks of LED drivers using such thermal extraction architecture.

In another aspect, the disclosure is directed to an electronic device, such as a camera, lighting device, or embedded computing or processing device. The device may include, for example, a printed circuit board (PCB). The printed circuit board may include a PCB thermal extraction area. The device may further include a housing assembly element including a housing thermal contact area. The device may further include a thermal extraction element including a first thermal contact area in thermal contact with the PCB thermal extraction area and a second thermal contact area in thermal contact with the housing thermal contact area. Heat may be transferred from the PCB to the thermal extraction element and then to the housing and external environment.

In another aspect, the disclosure relates to a camera head. The camera head may include, for example, a housing including a top camera head assembly and a bottom camera head assembly, a plurality of thermal extraction PCBs, a plurality of PCB edge heat transfer rings thermally coupled to the plurality of thermal extraction PCBs, and a cylindrical thermal extraction element thermally coupled between the PCB edge heat transfer rings and the housing to transfer heat from the plurality of PCBs to the housing. The housing may further include a plurality of LEDs to illuminate an area being imaged. The one or more LEDs may be powered from one or more of the plurality of PCBs.

Various additional aspects, features, and functions are described below in conjunction with the appended Drawings.

BRIEF DESCRIPTION OF THE DRAWINGS

The present application may be more fully appreciated in connection with the following detailed description taken in conjunction with the accompanying drawings, wherein:

FIG. 11 is a top detailed view of embodiments of a camera PCB and thermal extracting element;

FIGS. 28-34 illustrate details of alternate thermal extraction element embodiments.

DETAILED DESCRIPTION

Overview

Figure 1:
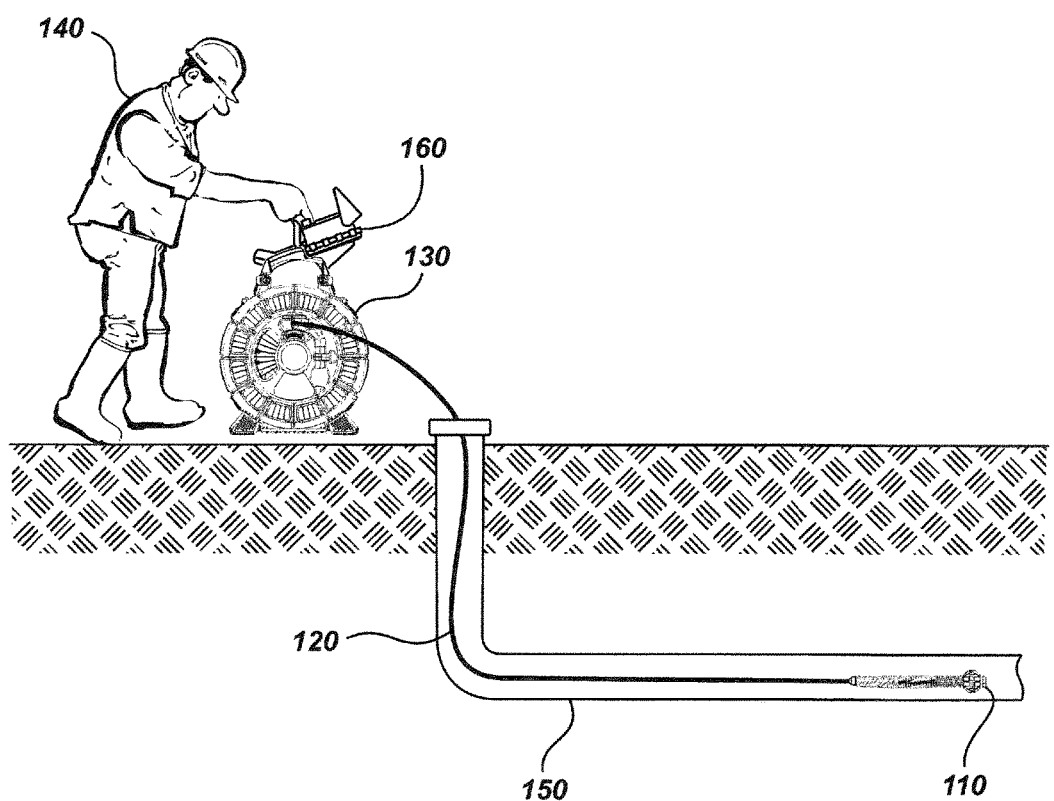
FIG. 1 is an illustration of a user with an example video inspection camera system.

Various details of the disclosure herein may be combined with inspection camera systems and components such as those described in co-assigned patents and patent applications including U.S. Pat. No. 6,697,102, issued Feb. 24, 2004, entitled BORE HOLE CAMERA WITH IMPROVED FORWARD AND SIDE VIEW ILLUMINATION, U.S. Pat. No. 6,831,679, issued Dec. 14, 2004, entitled VIDEO CAMERA HEAD WITH THERMAL FEEDBACK LIGHTING CONTROL, U.S. Pat. No. 6,862,945, issued Mar. 8, 2005, entitled CAMERA GUIDE FOR VIDEO PIPE INSPECTION SYSTEM, U.S. Pat. No. 6,958,767, issued Oct. 25, 2005, entitled VIDEO PIPE INSPECTION SYSTEM EMPLOYING NON-ROTATING CABLE DRUM STORAGE, U.S. patent application Ser. No. 11/928,818, filed Oct. 30, 2007, entitled PIPE MAPPING SYSTEM, U.S. Provisional Patent Application No. 61/034,907, filed Mar. 7, 2008, entitled PIPE INSPECTION IMAGING SYSTEM, U.S. patent application Ser. No. 12/399,859, filed Mar. 6, 2009, entitled PIPE INSPECTION SYSTEM WITH SELECTIVE IMAGE CAPTURE, U.S. patent application Ser. No. 12/704,808, filed Feb. 12, 2010, entitled PIPE INSPECTION SYSTEM WITH REPLACEABLE CABLE STORAGE DRUM. The content of each of these applications is incorporated by reference herein in its entirety. These applications may be individually or collectively referred to herein as the "incorporated applications."

In accordance with various aspects, a camera head with thermal extraction architecture may include a camera head capable of reducing thermal resistance for heat sensitive components such as digital image sensors. Such a camera head may be used in a variety of applications including, in an exemplary embodiment, in a pipe inspection system.

In one aspect, a camera head with a thermal extraction architecture configuration may include a housing or mounting assembly or other component including a thermal contact area, a printed circuit board (PCB), and a thermal extraction (also denoted herein as "extracting") element disposed between the PCB and housing to transfer heat from the PCB to the housing and external environment.

The PCB may contain a series of thermal extracting, electrical connecting, and/or insulating layers. The thermal extracting layer or layers and/or electrical connecting layer or layers may alternate with insulating layers between each, such that the thermal extracting layers never directly come in contact with the electrical connecting layers.

The sides or other areas or surfaces of the thermal extraction PCB may be configured to allow the thermal extraction piece or element to make contact with the thermal extracting layer or layers to conduct heat away from the PCB, such as at the contact areas. In turn, the thermal extracting piece or element may contact the housing or assembly to conduct heat from the PCB to the housing or assembly. A reduction of thermal resistance to heat sensitive components on the specialized PCB may be achieved whereby heat may be channeled away from sensitive components through the thermal extracting layers, through the thermal extraction element, and redistributed to the camera head housing or assembly. In some embodiments, the camera head may have several PCBs or a PCB stack where a thermal extraction element may be used for each PCB.

In another aspect, a thermally conductive shoe or ring may be secured along the edge of a thermal extracting PCB, such as by solder. The thermally conductive shoe may contact a thermal extraction element that further redistributes heat away from sensitive components on the PCB and to the device housing or assembly. In some embodiments a stack of multiple thermal extracting PCBs may be used, in which case each PCB may receive a thermally conductive ring, and a single thermal extraction element may encapsulate the stack of thermal extracting PCBs to provide bulk heat transfer. In yet other embodiments where a stack of multiple thermal extracting PCBs may be used, each PCB may receive a thermally conductive shoe as well as an individual thermal extraction element for each thermal extracting PCB.

In another aspect, the camera head may include a lighting element to generate light for illuminating a subject area, for instance using light emitting diodes (LEDs).

In another aspect, a thermal extraction PCB may be a rectangular, square, or other non-round shapes. Furthermore, the thermal extraction element or elements need not fully encapsulate the sides of the thermal extraction PCB or PCBs. For example, some embodiments may have one thermal extraction element only along one or two sides of a rectangular thermal extraction PCB.

In another aspect, the thermal extraction architecture described herein in combination with camera heads may also be used in a wide variety of other systems and devices where cooling of internal components is needed or desired. For instance, LED lighting systems may benefit from cooling of stacks of LED driver circuits using such a thermal extraction architecture.

In another aspect, the disclosure is directed to an electronic device, such as a camera, lighting device, or embedded computing or processing device. The device may include, for example, a printed circuit board (PCB). The printed circuit board may include a PCB thermal extraction area. The device may further include a housing assembly element including a housing thermal contact area. The device may further include a thermal extraction element including a first thermal contact area in thermal contact with the PCB thermal extraction area and a second thermal contact area in thermal contact with the housing thermal contact area. Heat may be transferred from the PCB to the thermal extraction element and then to the housing and external environment.

The PCB thermal extraction area may, for example, be along an edge or side of the PCB or adjacent to the edge of a side of the PCB. The PCB may be a circular or oval PCB. The PCB may be a square or rectangular PCB. The PCB may be shaped to conform to an internal volume of the housing. The device may further include a PCB edge heat transfer ring or shoe. The PCB edge heat transfer ring may be disposed between the PCB thermal extraction area and the thermal extraction element first contact area. The PCB edge heat transfer ring may be soldered or otherwise attached to the PCB and/or the thermal extraction element.

The PCB may, for example, include a plurality layers including at least a first thermal extraction layer integral with or coupled to the PCB thermal extraction area. The plurality of layers may include one or more insulation layers and one or more electrical connection layers. The one or more electrical connection layers may be electrically isolated from the first thermal extraction area and the PCB thermal extraction area. The plurality of layers may include a first electrical connection layer and a first insulation layer. The first insulation layer may be disposed between the first electrical connection layer and the thermal conduction layer.

The thermal extraction element may be shaped in a cut toroidal shape having upper and lower lips and a mid section. The upper and/or lower lips may be in thermal contact with the housing thermal contact area and the mid section may be in thermal contact with the PCB thermal contact area.

The device may further include, for example, an imaging sensor to generate images or a video stream disposed on the PCB. The may further include one or more LEDs and one or more LED light power circuits disposed on the PCB. The device may further include a microprocessor or digital signal processor or other processing device or processing element for processing signals from the camera, which may be disposed on the PCB.

The thermal extraction element may, for example, be in a circular or oval shape. The thermal extraction element may be in a combined S shape or other shape. The thermal extraction element may be in a cylindrical shape. The cylindrical shape may include a plurality of tabs or other outward and/or inward projecting structures. The tabs may be in thermal contact with one or more PCB thermal contact areas and/or the housing thermal contact areas. The device may further include one or more additional PCBs having thermal contact areas. The thermal contact areas of the one or more additional PCBs may be in thermal contact with one or more of the tabs. The device may further include a plurality of heat transfer rings or shoes. The heat transfer rings or shoes may be in thermal contact between the PCB thermal contact areas and the thermal extraction element. The housing may include an internal groove or slot to retain the thermal extraction element. The housing may include a ridge or ring to retain the thermal extraction element.

In another aspect, the disclosure is directed to a camera head. The camera head may include, for example, a housing including a top camera head assembly and a bottom camera head assembly, a plurality of thermal extraction PCBs, a plurality of PCB edge heat transfer rings thermally coupled to the plurality of thermal extraction PCBs, and a cylindrical thermal extraction element thermally coupled between the PCB edge heat transfer rings and the housing to transfer heat from the plurality of PCBs to the housing. The housing may further include a plurality of LEDs to illuminate an area being imaged. The one or more LEDs may be powered from one or more of the plurality of PCBs.

Various additional aspects, features, and functions are described below in conjunction with FIGS. 1 through 35 of the appended Drawings.

It is noted that as used herein, the term, "exemplary" means "serving as an example, instance, or illustration." Any aspect, detail, function, implementation, and/or embodiment described herein as "exemplary" is not necessarily to be construed as preferred or advantageous over other aspects and/or embodiments.

Example Embodiments

Turning to FIG. 1, a thermal extraction architecture camera system embodiment in accordance with various aspects is illustrated in an example buried pipe video inspection application. A camera head embodiment, such as the camera head 110, may be configured with a thermal extraction architecture such as described herein and may be secured to a push-cable 120, which may be coupled to a cable reel 130 (and associated components, such as those described in the incorporated applications).

In operation, a user 140 may feed the push-cable 120 with attached camera head 110 from the cable reel 130 into a pipe 150. The camera head 110 may generate and provide images and/or a video signal to be displayed on a camera control unit or CCU 160, such as to locate and image clogs, obstructions, breaks, or other problem areas within the pipe 150. Because a compact and water tight camera head is needed in such a pipe inspection application (e.g., due to presence of water or other contaminants), overheating may become a problem. In such applications, a camera head designed with a thermal extraction architecture such as described herein to extract heat away from any heat sensitive components may be particularly desirable. In a typical thermal extraction architecture, one or more PCBs or other electronic circuit substrates include a thermal contact area, such as at the edge of the PCBs, to transfer heat away from the PCB. The PCB may include heat transfer layers, which may be thermally coupled to heat generating elements of the associated electronic circuit, such as power supply components, high-speed digital components, imaging sensors, processors, lighting elements, or other electronic components that generate significant heat either alone or in the aggregate. A thermal extraction element including a first thermal contact area for contact with the thermal extraction area of the PCB and a second thermal contact area for contact with a thermal extraction area of an associated device body or housing, may be positioned between the PCB and housing so as to transfer heat from the PCB to the housing and then to the external environment. The thermal extraction element may be flexible so as to allow a pressed fit between the housing and the PCB, and may contact the PCB for heat transfer entirely or primarily along the edges of the PCB. Flexibility of the thermal extraction element may also aid in reducing vibration or shock impacts applied to the device, which may protect sensitive components and/or reduce impact damage to the device. In an exemplary embodiment, the thermal extraction architecture is implemented in a camera head or other video or still imaging device or lighting device, however, other embodiments may include any device having an enclosed volume where heat is generated, such as compact or miniature microprocessor-based devices, digital signal processing devices, or other devices that generate heat via analog or digital circuitry.

Figure 2:
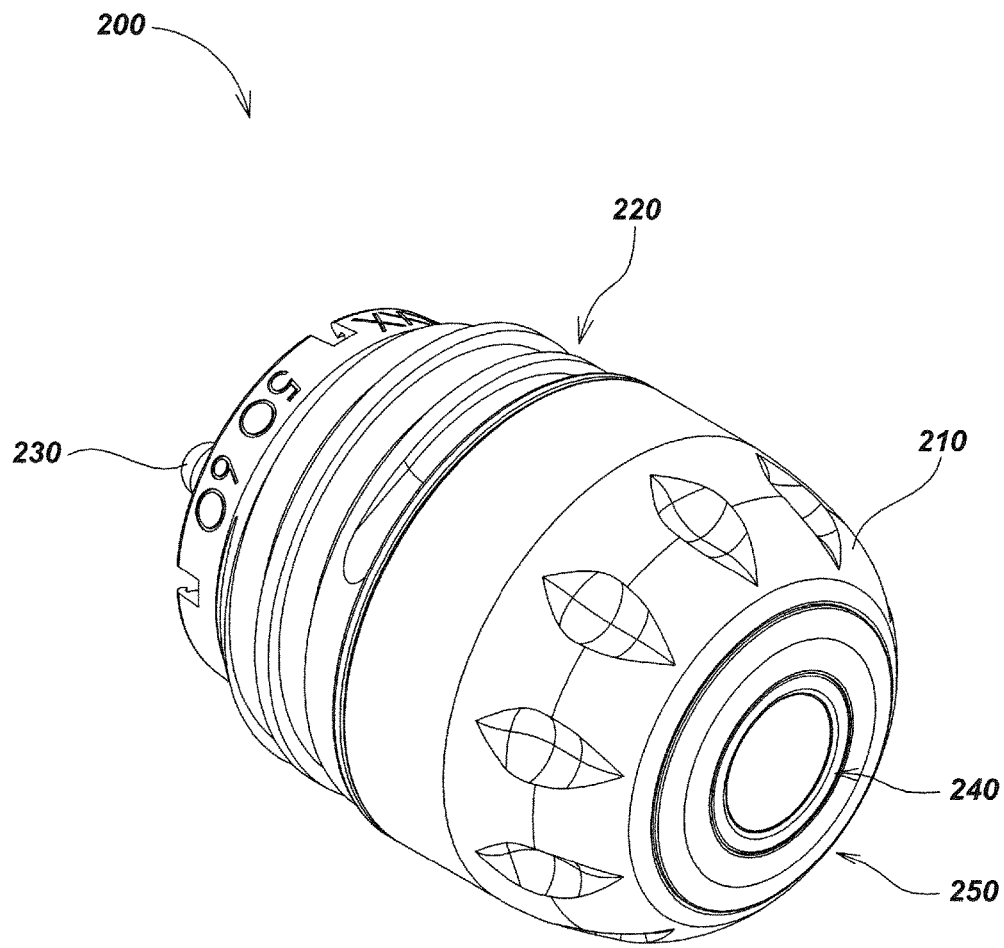
FIG. 2 is an isometric view of a camera head embodiment in accordance with certain aspects.
Figure 3:
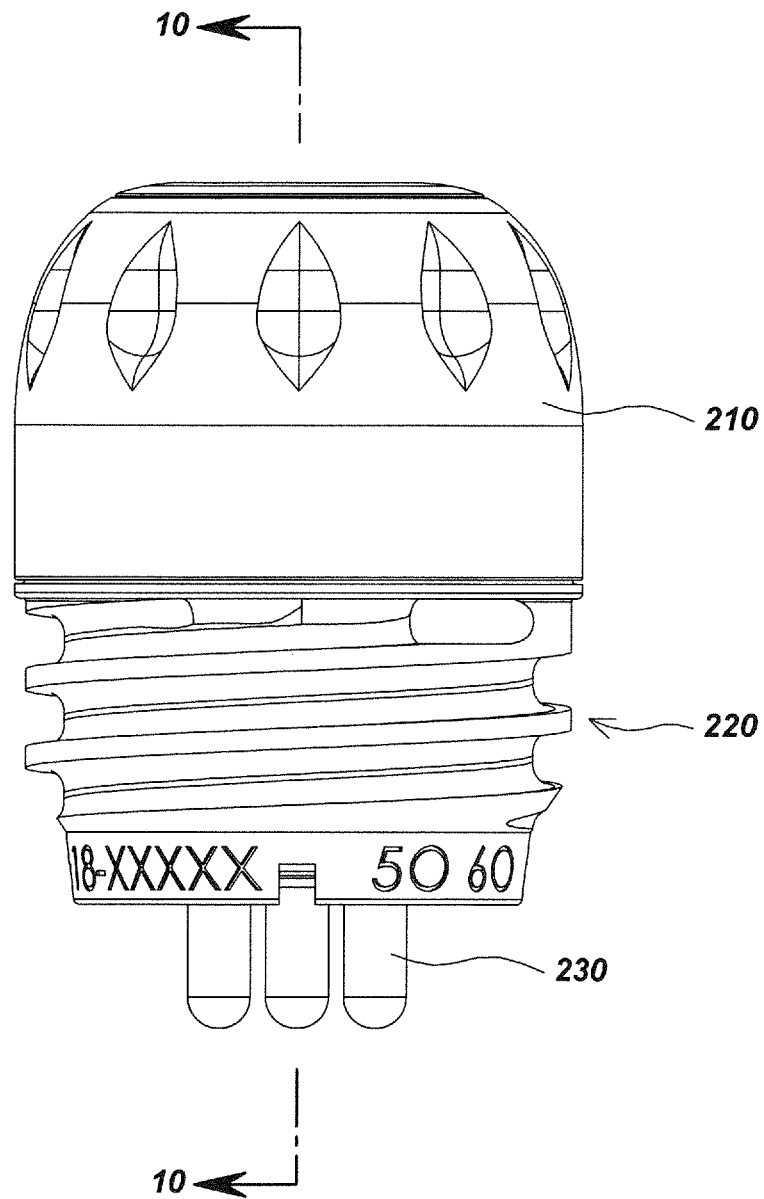
FIG. 3 is a side view of the camera head embodiment of FIG. 2.

Attention is now directed to FIGS. 2 and 3, which illustrate details of an exemplary embodiment of a camera head 200 having a thermal extraction architecture to direct internal heat to an outer housing or assembly and then to the external environment. Camera head embodiment 200 may include a front housing piece or element 210 and a rear housing assembly 220, or the housing may include few elements or a single integral element. Various other configurations of housings or housing assemblies or other structural heat sink elements may be used in alternate embodiments.

A pin connector 230 may extrude from rear of the rear housing assembly 220, such as to direct images or video signals, data, or other information or power to or from the camera head. A camera module 240 and a light module 250 (as shown in FIG. 2) may be fitted inside the front housing piece 210 so as to provide an illuminated forward field of vision to the camera module 240. Glass, plastic, or sapphire ports may be used to provide strength and protection against impacts, scratches, and other damage, such as for cameras deployed within underground water or sewer lines.

Figure 4:
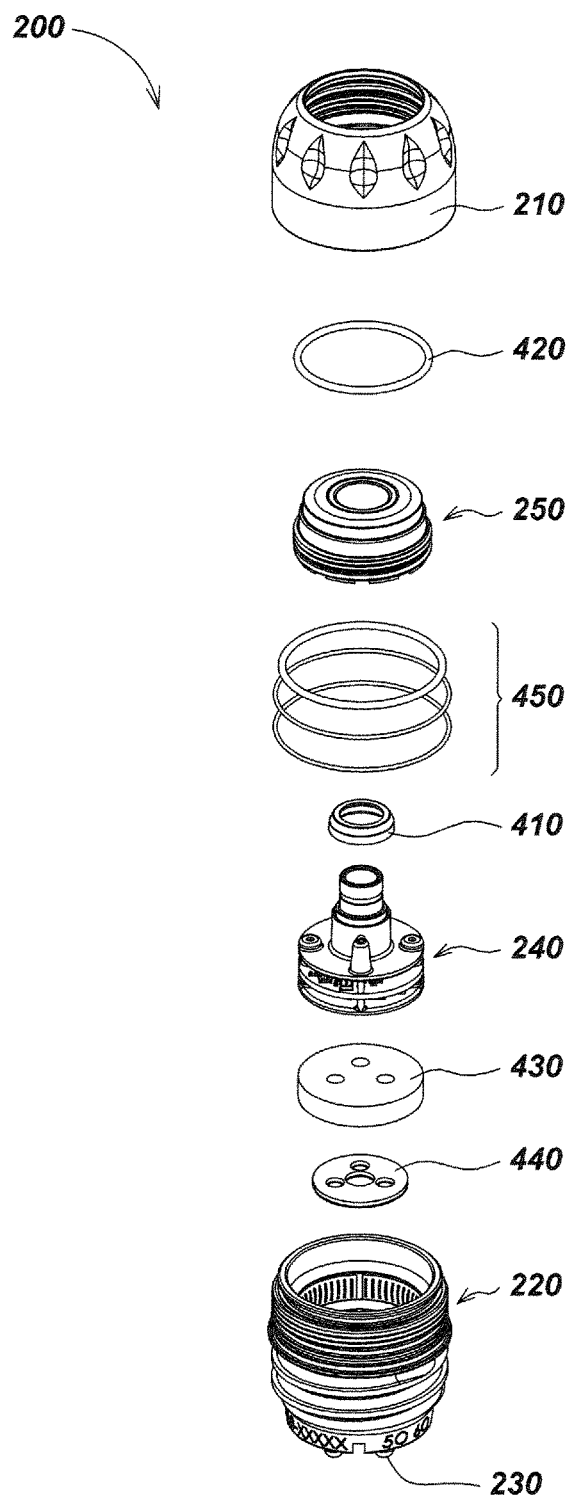
FIG. 4 is a top down exploded view of the camera head embodiment of FIG. 3.
Figure 5:
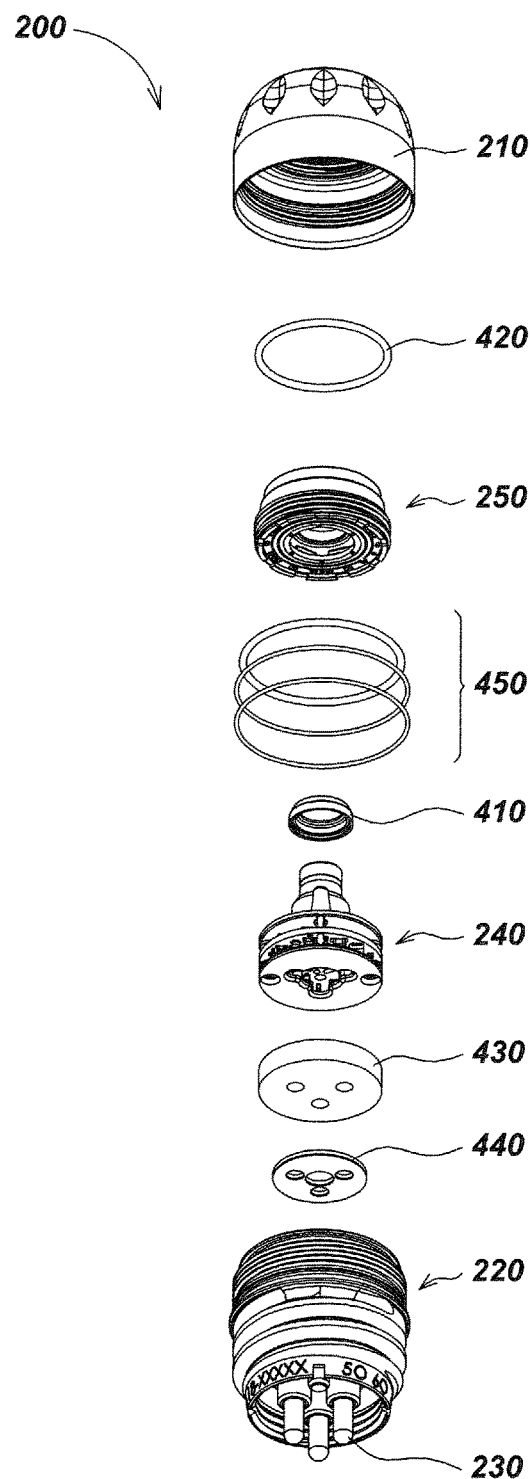
FIG. 5 is a bottom up exploded view of the camera head embodiment of FIG. 3.

Turning to FIGS. 4 and 5, top-down and bottom-up exploded views of additional details of the embodiment 200 of FIG. 2 further illustrate the internal assembly of the camera head embodiment 200 and corresponding thermal extraction architecture. During assembly, the top end of the camera module 240 may be seated within the center hole of the light module 250 with a retainer ring 410 situated in between. A small O-ring 420 may be fitted within the front housing piece 210 to help create a water tight seal. A foam spacer disk 430 and a desiccant disk 440 may be positioned between the bottom side of the camera module 240 and the rear housing assembly 220 such that they may fit within the rear housing assembly 220. The desiccant disk 440 may comprise materials designed to maintain dryness within the camera head. The foam spacer disk 430 and/or the desiccant disk 440 may be formed with a series of centrally located holes, allowing connections from the pin connector 230 to the pass through. One or more housing O-rings 450 may be fitted between the front housing piece 210 and rear housing assembly 220 creating a water tight seal.

In order to facilitate channeling of heat from the interior of the camera head to the outer housing or assembly to dissipate heat, the camera head may include a thermal extraction architecture. Such architecture may include housing or assembly elements or components with thermal contact areas, as well as a thermal extraction element and a printed circuit including a thermal extraction area to channel heat to the thermal extraction element and then to the housing and exterior environment.

Figure 6:
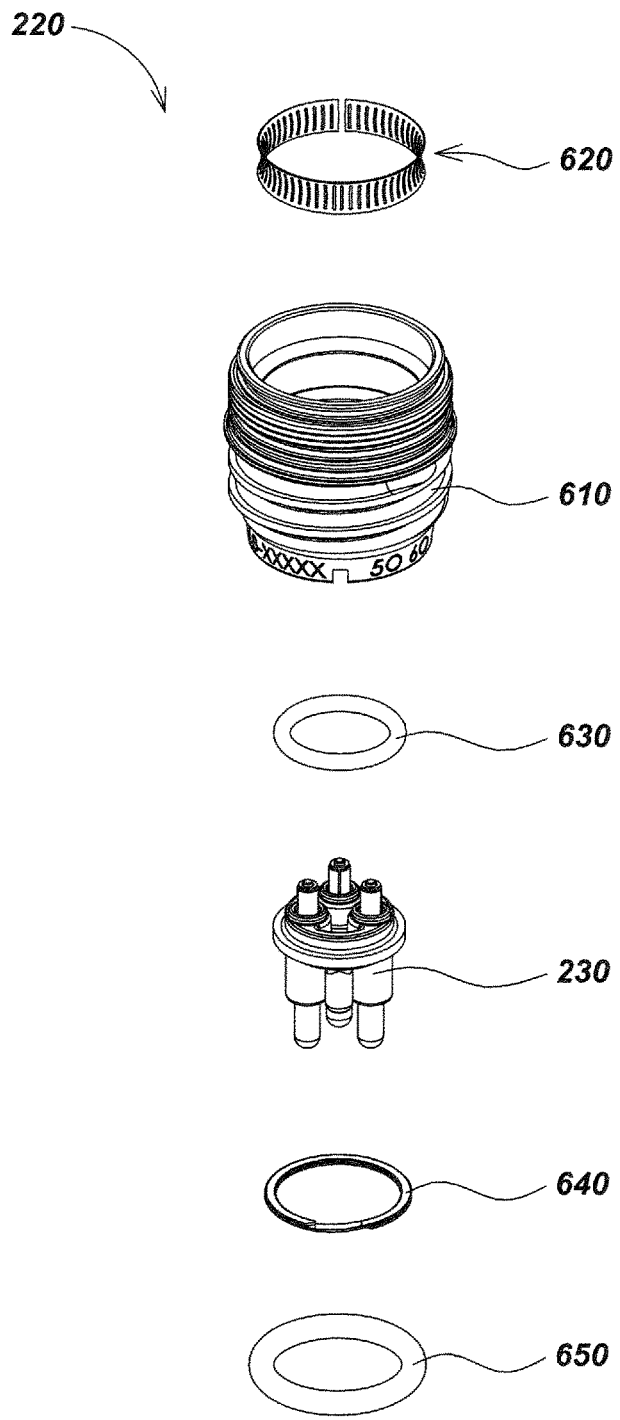
FIG. 6 is a top down exploded view of a rear housing assembly embodiment.

For example, as shown in FIG. 6, the rear housing assembly 220 may include a rear housing element 610, which may be substantially cylindrical in an exemplary embodiment, along with a thermal extraction element embodiment 620, in this example in the shape of a cut toroid, as well as a connector O-ring 630, pin connector 230, a snap ring 640, and a large connector O-ring 650.

Figure 7:
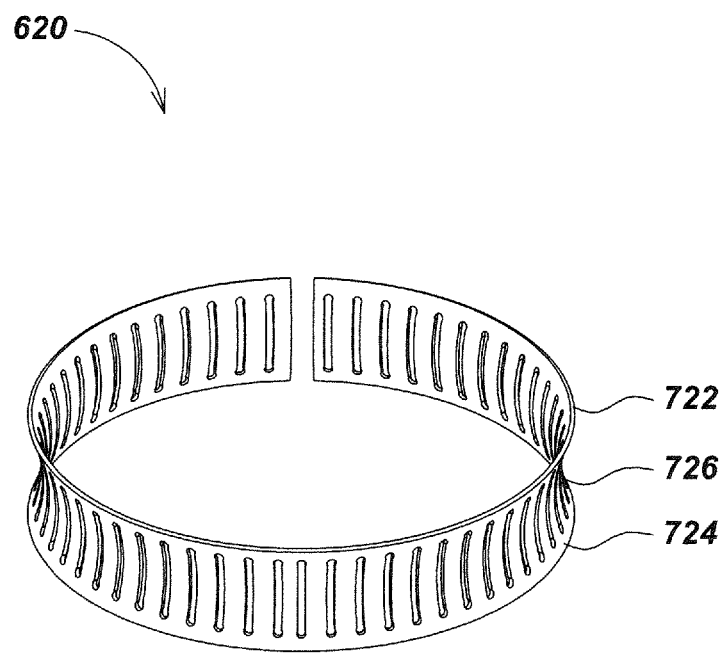
FIG. 7 is an isometric detailed view of a cut toroidal shaped thermal extraction element embodiment.
Figure 25:
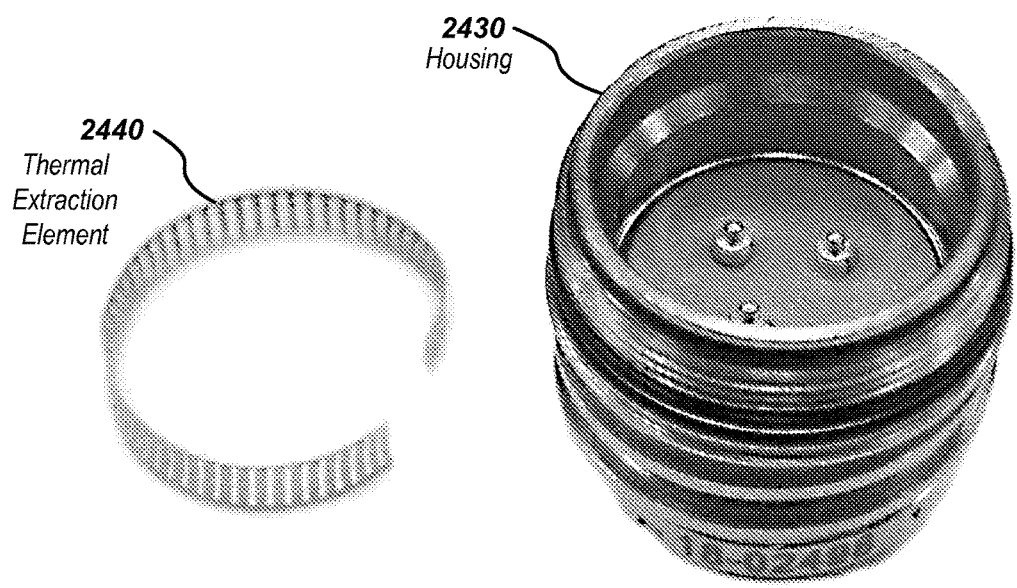
Figure 26:
FIG. 26 illustrates details of a camera head PCB and optics embodiment and a corresponding cut toroidal shaped thermal extraction element embodiment.

The thermal extraction element 620, as shown in greater detailed in FIG. 7, may be largely toroidal in shape in an exemplary embodiment and may be cut along a line paralleling the circumference as shown. Additional images of implementation of a thermal extraction element as shown in FIG. 7 are shown in FIGS. 25 and 26. The thermal extraction elements may comprise metallic or non-metallic thermally conductive materials, such as metals, thermally conductive plastics, ceramics, composites, carbon materials, or other materials or compounds having high thermal conductivity.

The thermal extractor element may include a first surface or area configured to be in thermal contact with a PCB where heat may be generated, as well as a second surface or area configured to be in thermal contact with the housing or assembly. Slots or grooves may be cut into the sides of the thermal extraction elements to provide additional flexibility and springiness and/or to reduce weight or provide better thermal contact areas or orientation of the thermal extraction element within the housing.

In an exemplary embodiment, the sides of the thermal extraction element 620 may be concave such that horizontal planes that intersect a top extractor lip 722 and a bottom extractor lip 724 on the toroid are of larger diameter than that of the horizontal plane that would bisect the extractor mid-section 726. Returning to FIG. 6, the thermal extraction element 620 may be dimensioned to snugly fit within rear housing piece 610 such that the top extractor lip 722 and the bottom extractor lip 724 make contact with the inner surface of the rear housing piece 610 at a thermal contact area or areas of the housing, such as through slight pressure caused by the flexibility and springiness of the thermal extraction element.

The small connector O-ring 630 and pin connector 230 may be configured to fit into the rear of the rear housing piece 610 with the snap ring 640 securing the pin connector 230 in place. The large connector O-ring 650 may then be fitted into the rear of the rear housing piece 610 to provide a waterproof seal between the camera head 200 (FIG. 2) and an applicable device such as the pipe inspection system described in connection with FIG. 1. The rear of the rear housing piece 610 may also be formed with threads to connect the camera head 200 (FIG. 2) to camera systems such as the pipe inspection system described in connection with FIG. 1.

Figure 8:
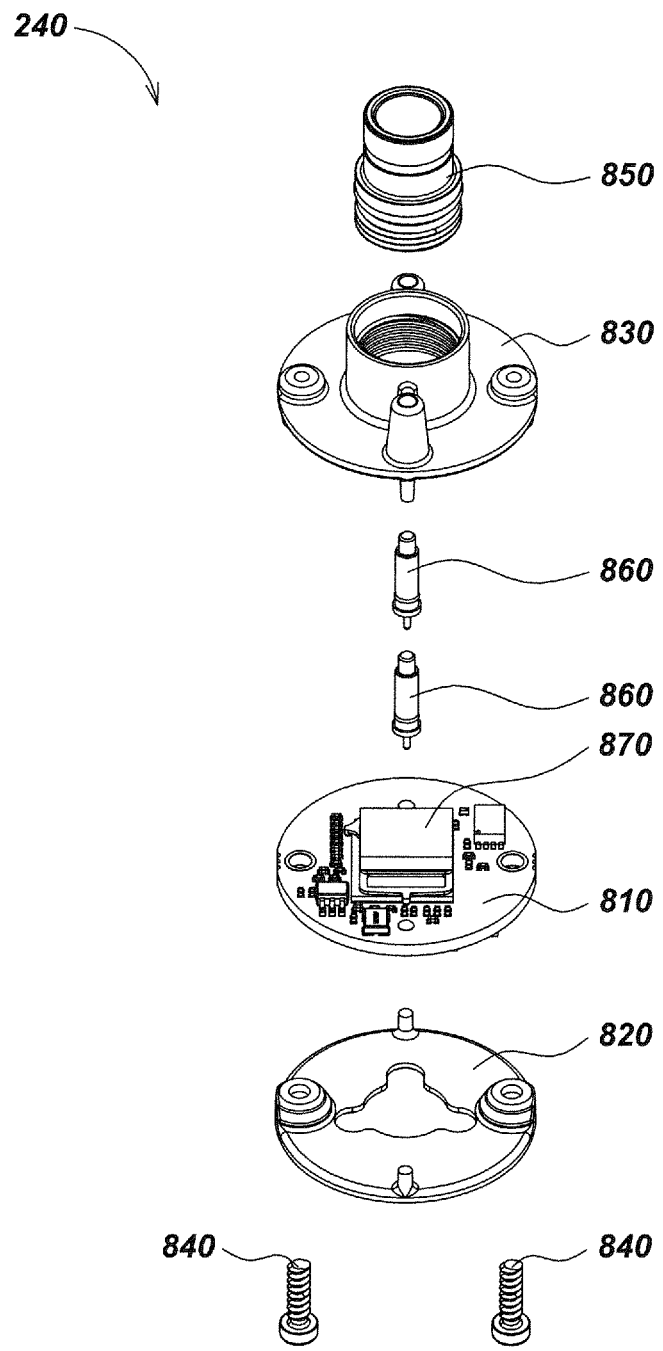
FIG. 8 is a top down exploded view of a camera module embodiment.

As shown in FIG. 8, a camera module embodiment 240 may include one or more printed circuit boards (PCBs), such as a thermal extracting camera PCB 810, which may be secured between a lower bracket 820 and a lens mount 830 by a set of screws 840 or other attachment mechanisms. The lower bracket 820 and lens mount 830 may be largely disk shaped in an exemplary embodiment. The lower bracket 820 may further be formed with a central hole allowing connections from the pin connector 230, best illustrated in FIG. 4, to pass through to the camera PCB 810. An image of a similar embodiment of a camera module is shown in FIG. 26.

Figure 23:
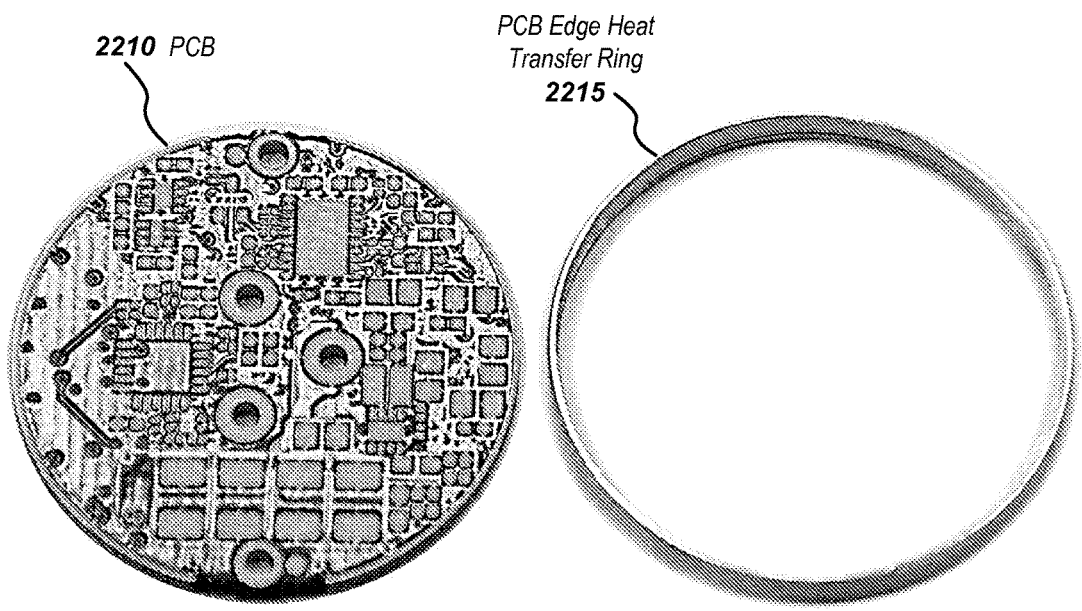

The lens mount 830 may further be formed with a central threaded cylinder designed to mate with the male threaded end of a lens module 850. The lens module 850 may contain a series of lenses tailored to the particular application of the camera head 200 (FIG. 2). The lens mount 830 may further be formed with two conical guide tubes designed to hold two electrical connecting spring pins 860 in place. The two electrical connecting spring pins 860 may be coupled to the camera PCB 810 to provide an electrical connection for delivery of electrical current to the light module 250 (best illustrated in FIG. 4). One or more filters, such as the IR filter 870, may by seated on top of the image sensor of the camera PCB 810. Heat may be removed from PCBs such as PCB 810 through the edge of the board, and an optional edge ring, such as shown in FIG. 23, may be thermally coupled to the PCB to direct heat outward from the PCB to an adjacent thermal extraction element.

Figure 9:
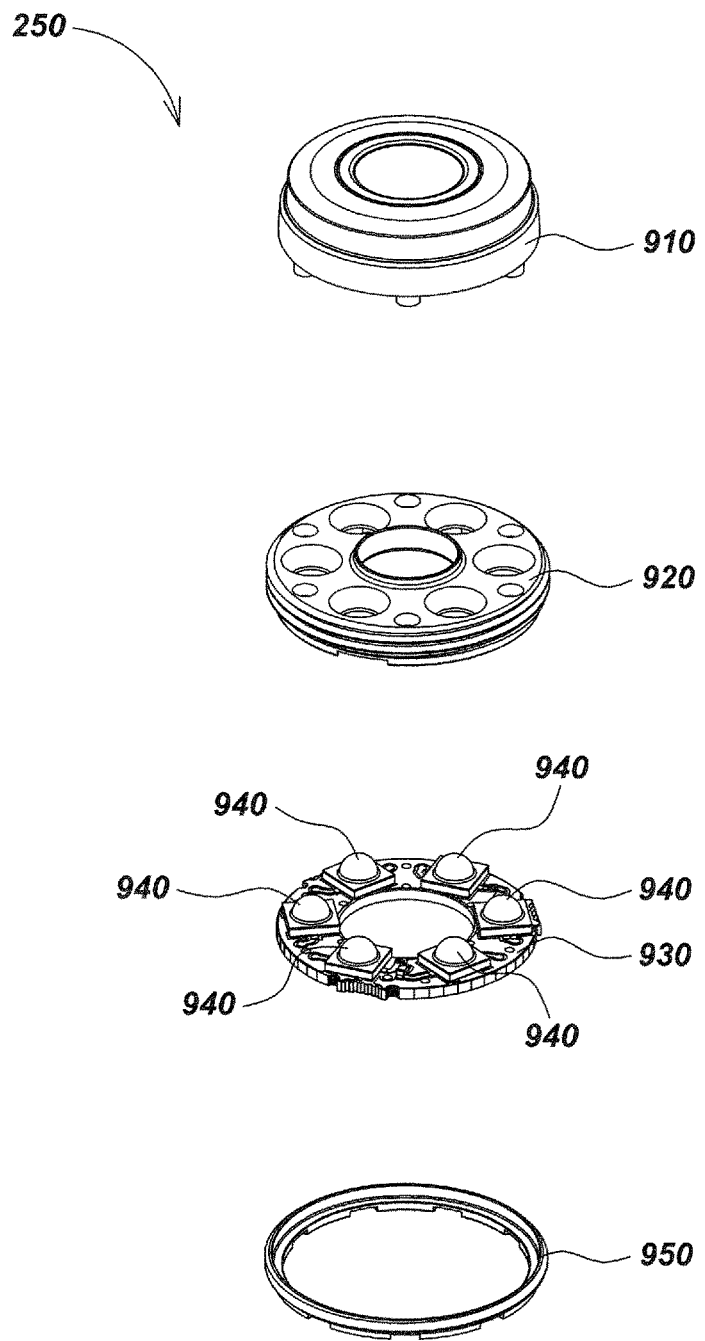
FIG. 9 is a top down exploded view of a light module embodiment.

Turning to FIG. 9, light module embodiment 250 may include a window piece or element 910, an LED reflector 920, a light module PCB 930, which may include one or more light emitting diodes or LEDs 940, and a retaining ring 950. The window piece 910, LED reflector 920, light module PCB 930, and/or retaining ring 950 may all be largely toroidal in shape and dimensioned to allow the top section of the camera module 240 to pass through the center of each of the light module 250 components.

The window piece or element 910 may comprise a material with translucent or transparent properties allowing light to pass though from powered LEDs 940 on the light module PCB 930. In assembly, the LED reflector 920 may be positioned between the window piece 910 and light module PCB 930. Holes formed through the surface of the LED reflector 920 may be formed to allow each LED 940 to pass through and effectively illuminate the work area. The LED reflector 920 may further be composed of reflective material allowing light from the LEDs 940 to more effectively light the work area. The retaining ring 950 may screw into place behind the light module PCB 930 securing the window piece 910, LED reflector 920, light module PCB 930 with LEDs 940, and retaining ring 950 together. The retaining ring 950 may be sized to allow the electrical connecting spring pins 860 (FIG. 8) access to connections on the back side of the light module PCB 930 in order to pass electrical current to the light module 250.

Figure 10:
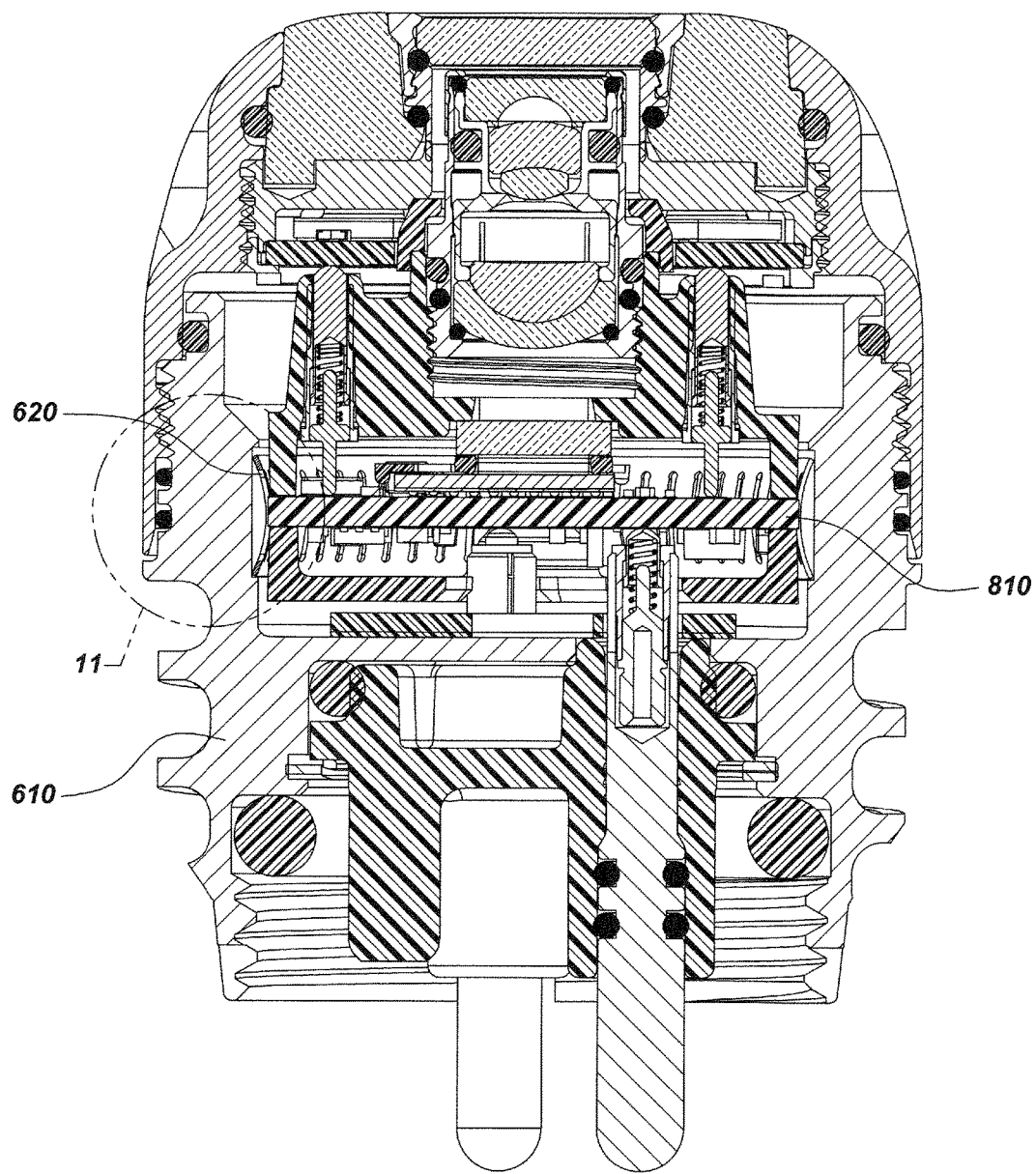
FIG. 10 is a sectional view of the embodiment of FIG. 3 along line 10-10.
Figure 11:
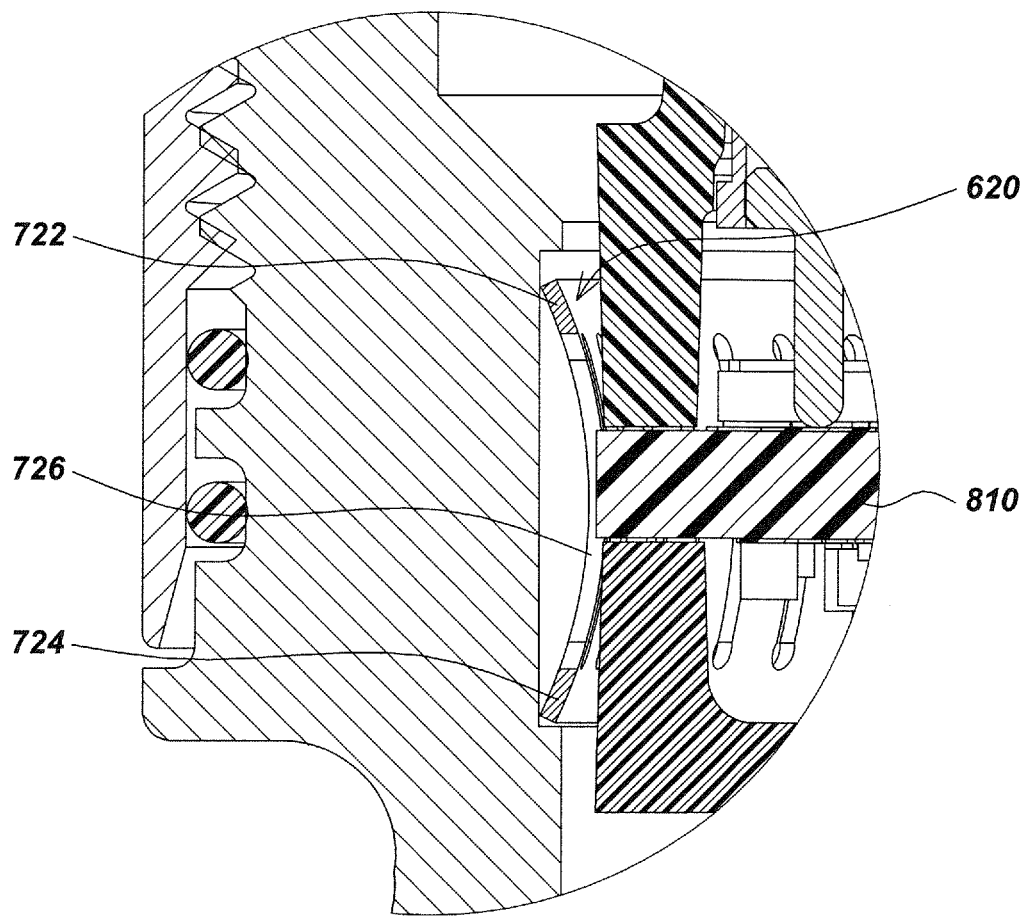
FIG. 11 is detailed view of section 11 of the embodiment of FIG. 10 showing the rear housing case, thermal extractor, and camera PCB.
Figure 12:
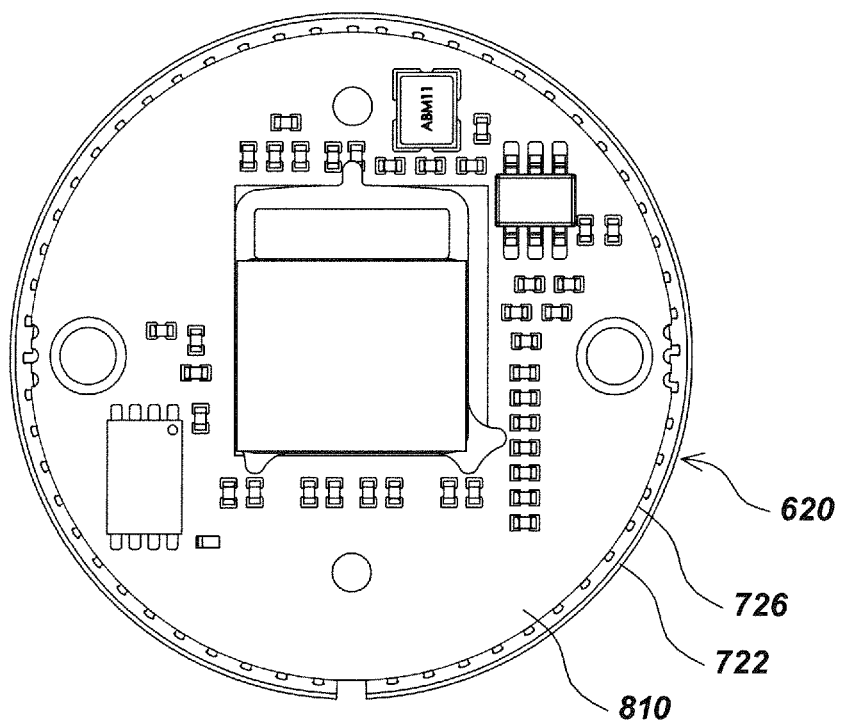
FIG. 12 is an illustration describing the configuration of the camera PCB embodiment.

FIGS. 10-12 further illustrate additional details of the inter-relationship between the rear housing element embodiment 610, the thermal extraction element embodiment 620, and the heat extracting PCB embodiment 810 in accordance with an exemplary camera head embodiment. During manufacturing/assembly, the top extractor lip 722 and/or bottom extractor lip 724, being of larger diameter than extractor mid-section 726 may contact the inner surface of the rear housing element 610 at one or more thermal contact areas. The extractor mid-section 726, being of smaller diameter than the top extractor lip 722 and bottom extractor lip 724 may contact the sides along the circumference of the camera PCB 810. The central area of the thermal extraction element may simultaneously be in thermal contact with one or more thermal contact areas of one or more internal PCBs (e.g., PCB 810) to direct heat from the PCBs to the rear housing element 610.

Figure 13:
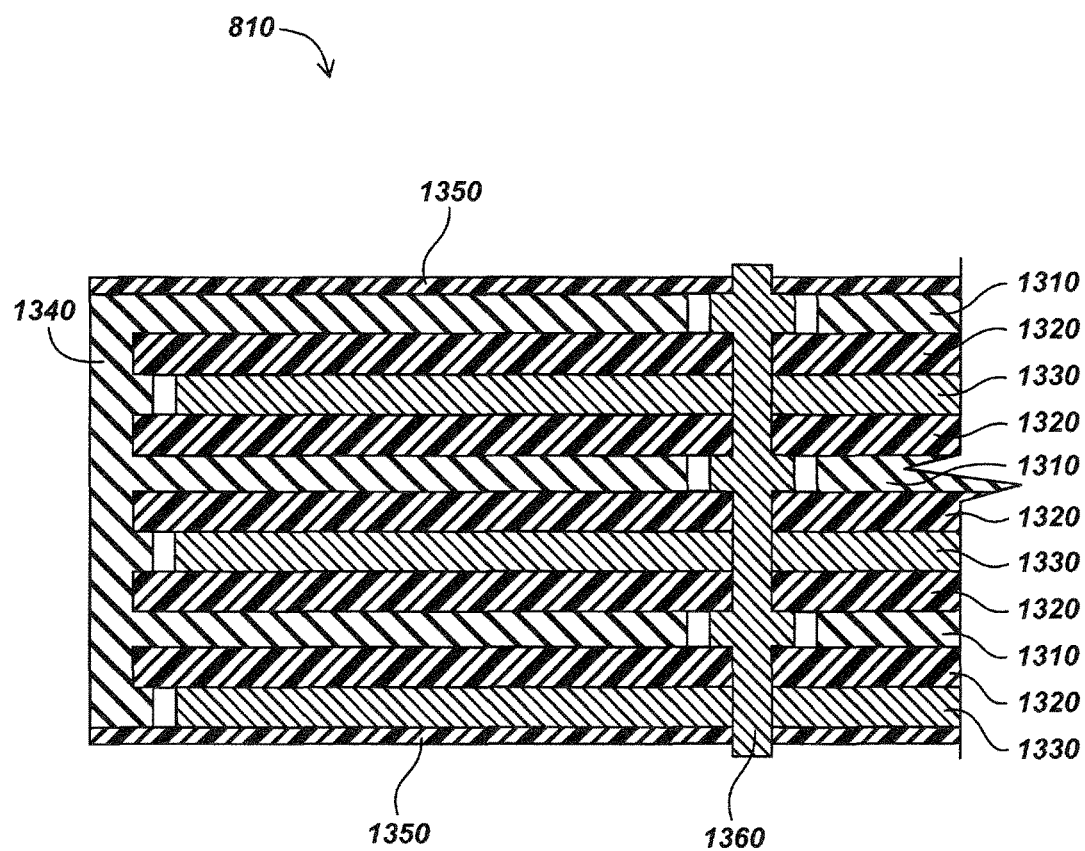
FIG. 13 is detailed cutaway view of the camera PCB embodiment.
Figure 14:
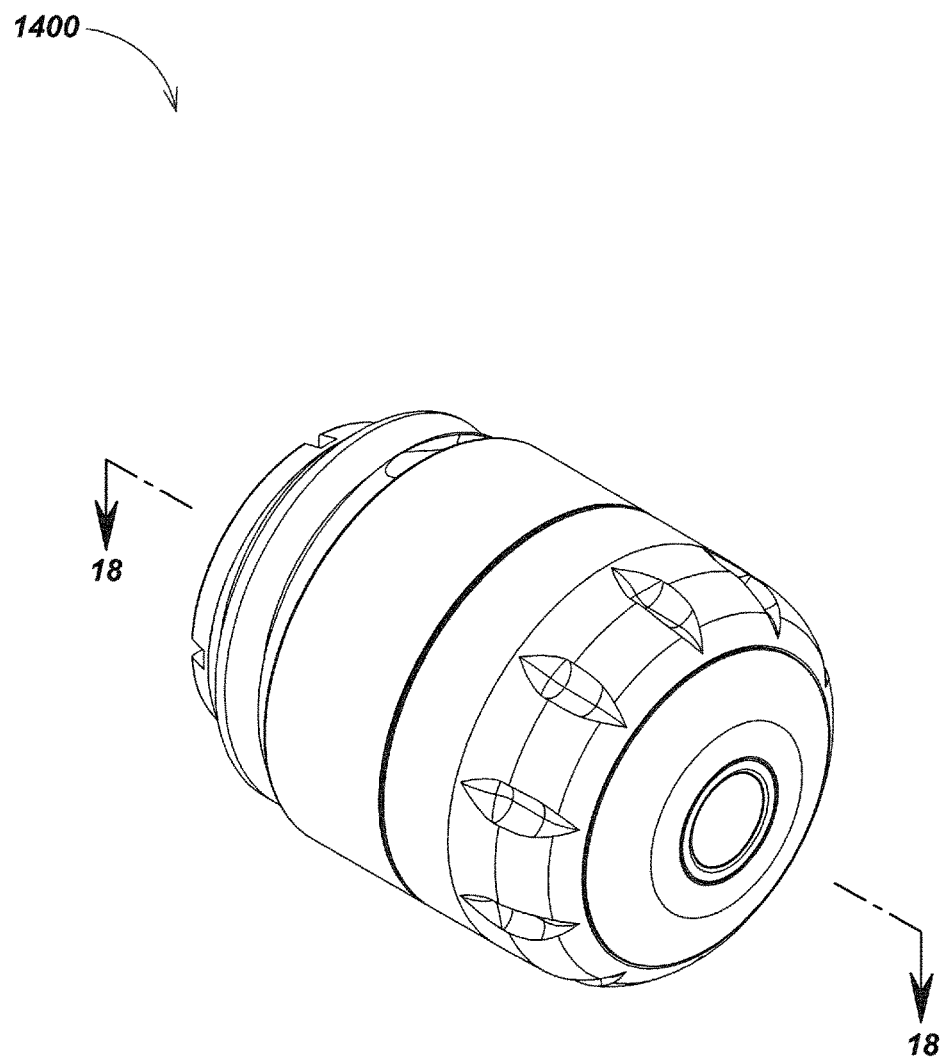
FIG. 14 is an isometric view of an alternative camera head embodiment in accordance with certain aspects.
Figure 15:
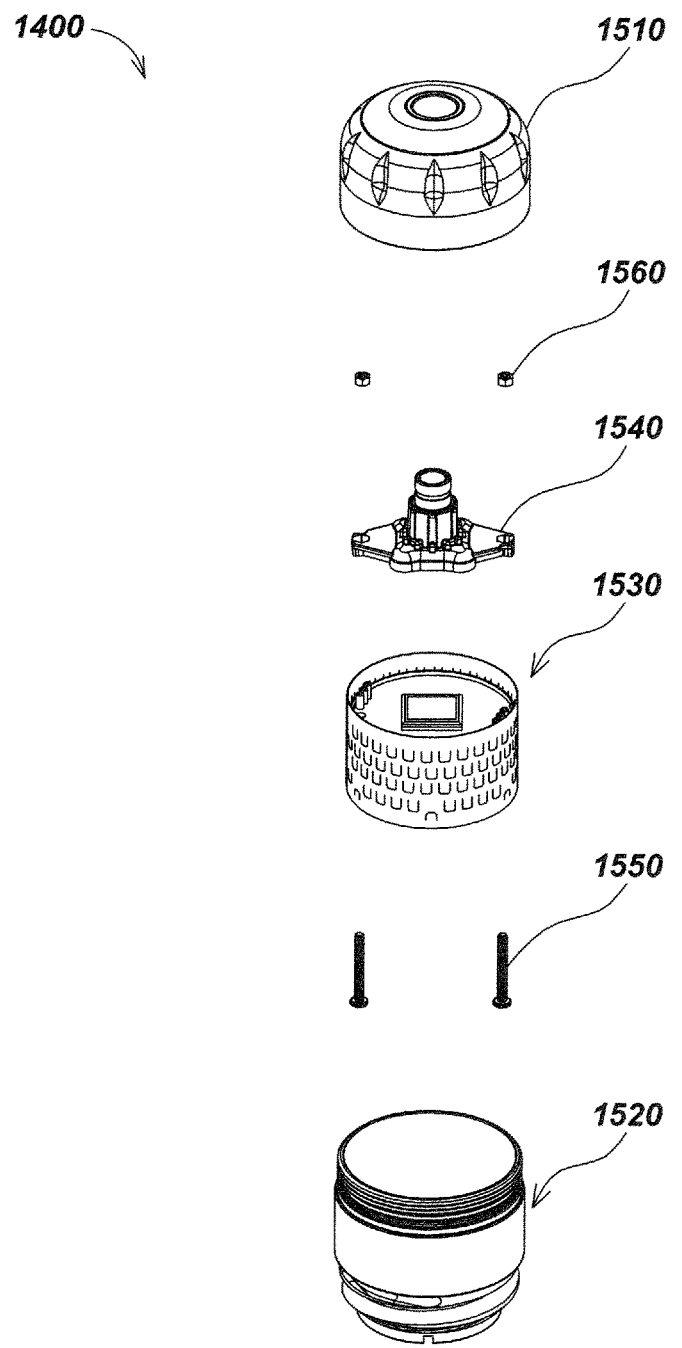
FIG. 15 is a partially exploded view of the camera head embodiment from FIG. 14.

As illustrated in the detailed cutaway of the camera PCB 810 in FIG. 13, the camera PCB 810 may comprise multiple layers of different materials to provide different functions including masking, thermal conduction, electrical insulation, and/or other circuit board functions. For example, in an exemplary embodiment, the camera PCB embodiment 810 may comprise one or more thermal extraction layers 1310, one or more insulating layers 1320, one or more electrical connecting layers 1330, and/or other layers (not shown).

The layering of the thermal extraction layers 1310 and the electrical connecting layers 1330 may alternate back and forth with, for example, one of the insulating layers 1320 between each such that none of the thermal extraction layers 1310 and none of the electrical connecting layers 1330 ever come into direct contact. One or more of the thermal extraction layers 1310 may connect to a side thermal connector section or area 1340 that may run along the circumference of the camera PCB 810 or may otherwise provide a thermal extraction area. The side area 1340 may be integral with our thermally coupled to an optional PCB edge heat transfer ring.

A gap, as illustrated in FIG. 13, may be formed between the side thermal connector section 1340 and the electrical connecting layers 1330. The gap may be filled with pre-preg (pre-impregnated composite fibres) or similar epoxy resin with insulating properties in manufacture. Solder mask layers 1350 may also be included on the top and bottom face of the camera PCB 810. In assembly, the side thermal connector section 1340 may make contact with the extractor mid-section 726.

One or more vias, such as via 1360, may further be used to electrically connect components connected to the electrical connecting layers 1330. In PCB embodiment 810, a gap may be formed between the thermal extraction layers 1310 and the via 1360 preventing the via 1360 with connected electrical connecting layers 1330 from directly physically contacting the thermal extraction layers 1310. The gaps between the thermal extraction layers 1310 and via 1360 may fill with pre-preg or similar epoxy resin with insulating properties in manufacture. In alternative embodiments, the gaps between the side thermal connector section 1340 and the electrical connecting layers 1330 and between the thermal extraction layers 1310 and via 1360 may also be filled with additional insulating material. In assembly, the side thermal connector section 1340 may make contact with the extractor mid-section 726. A camera head, such as the camera head 200 (FIG. 2) may be able to reduce thermal resistance and effectively redistribute heat from components such as those on the camera PCB 810 into rear housing piece 610 (FIG. 6).

In use, a camera head, such as the camera head 200 (FIG. 2), may be able to reduce thermal resistance and effectively redistribute heat from components such as those on the camera PCB 810 and/or other internal PCBs (not shown) into rear housing piece 610.

Turning to FIGS. 14-19, another camera head embodiment 1400 may include a top camera head assembly 1510, a bottom camera head assembly 1520, a thermal extraction assembly 1530, a lens assembly 1540, and a set of bolts 1550 and nuts 1560 that may be used to secure the PCB stack of the thermal extraction assembly 1530 to the lens assembly 1540.

Figure 16:
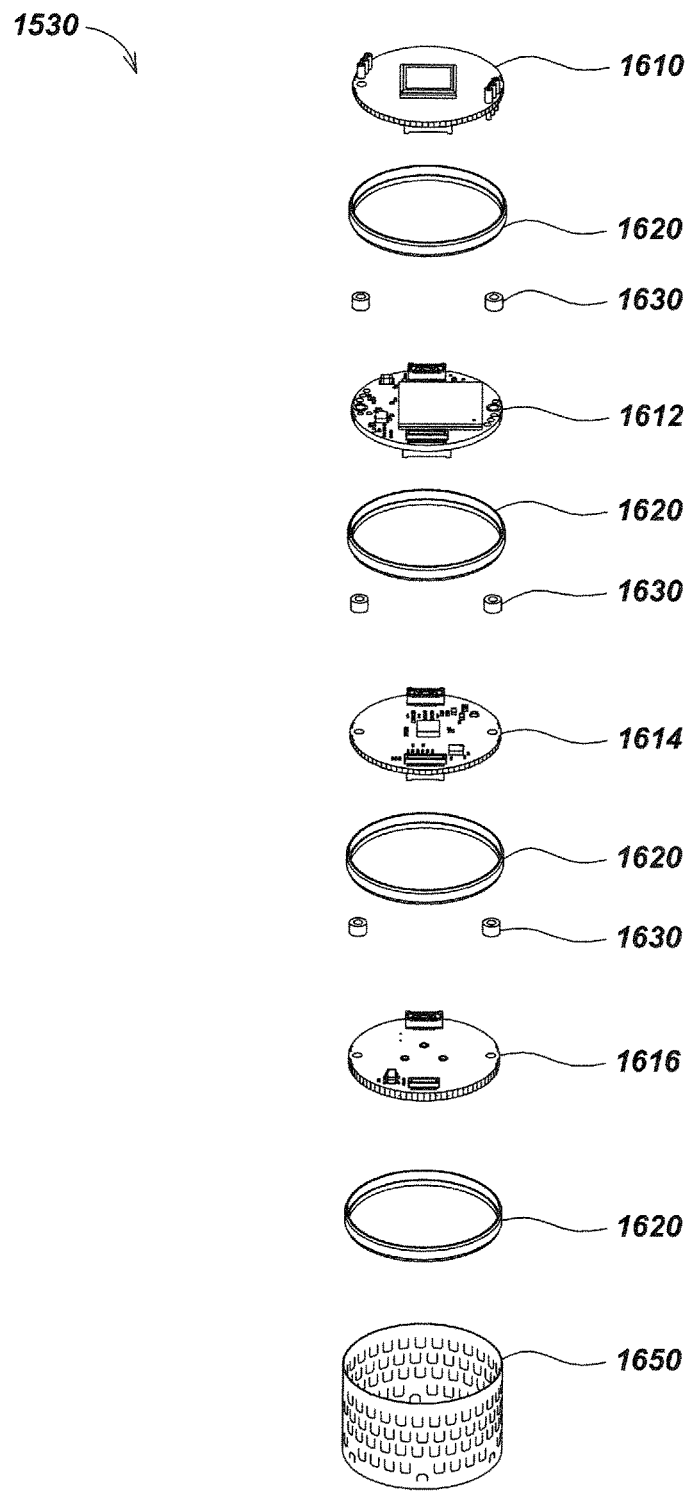
FIG. 16 is a top down exploded view of the thermal extraction assembly from FIG. 15.
Figure 17:
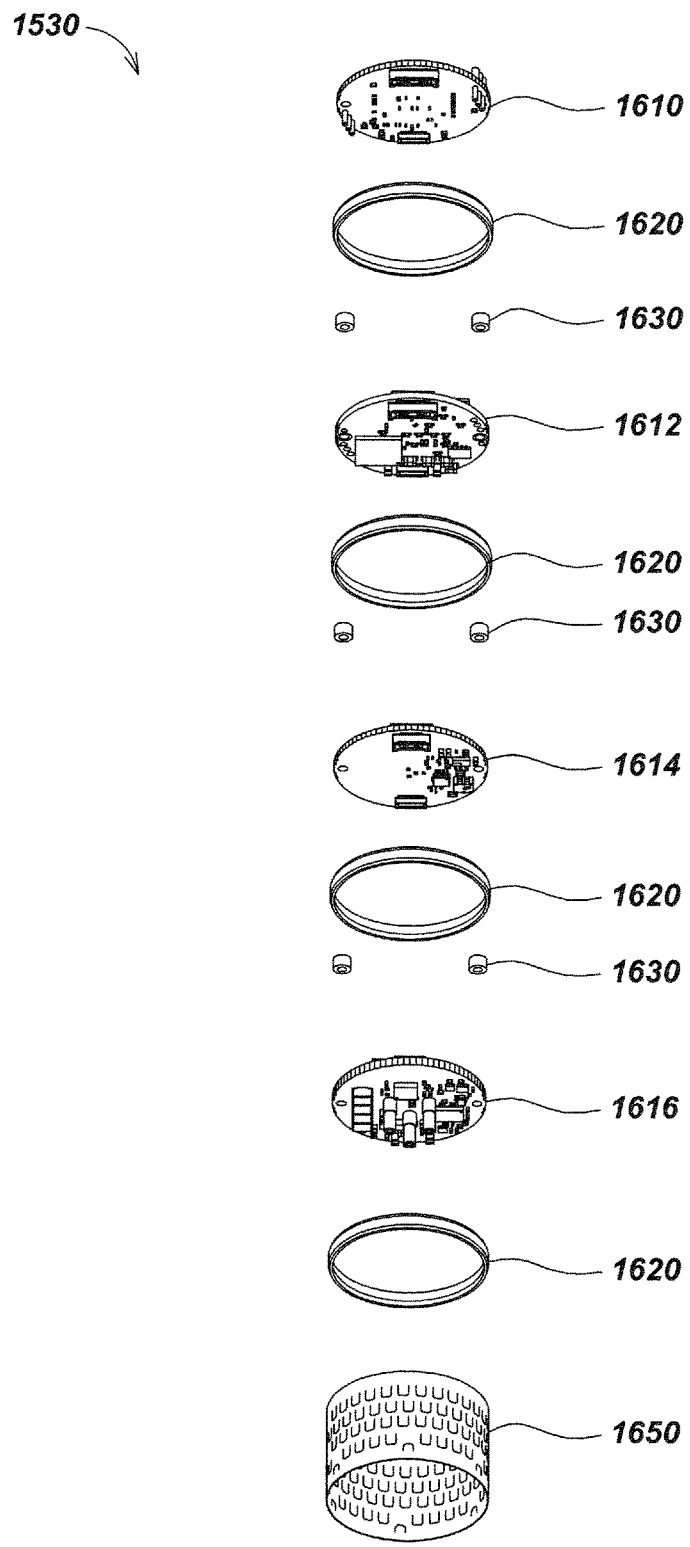
FIG. 17 is a bottom up exploded view of the thermal extraction assembly from FIG. 15.
Figure 18:
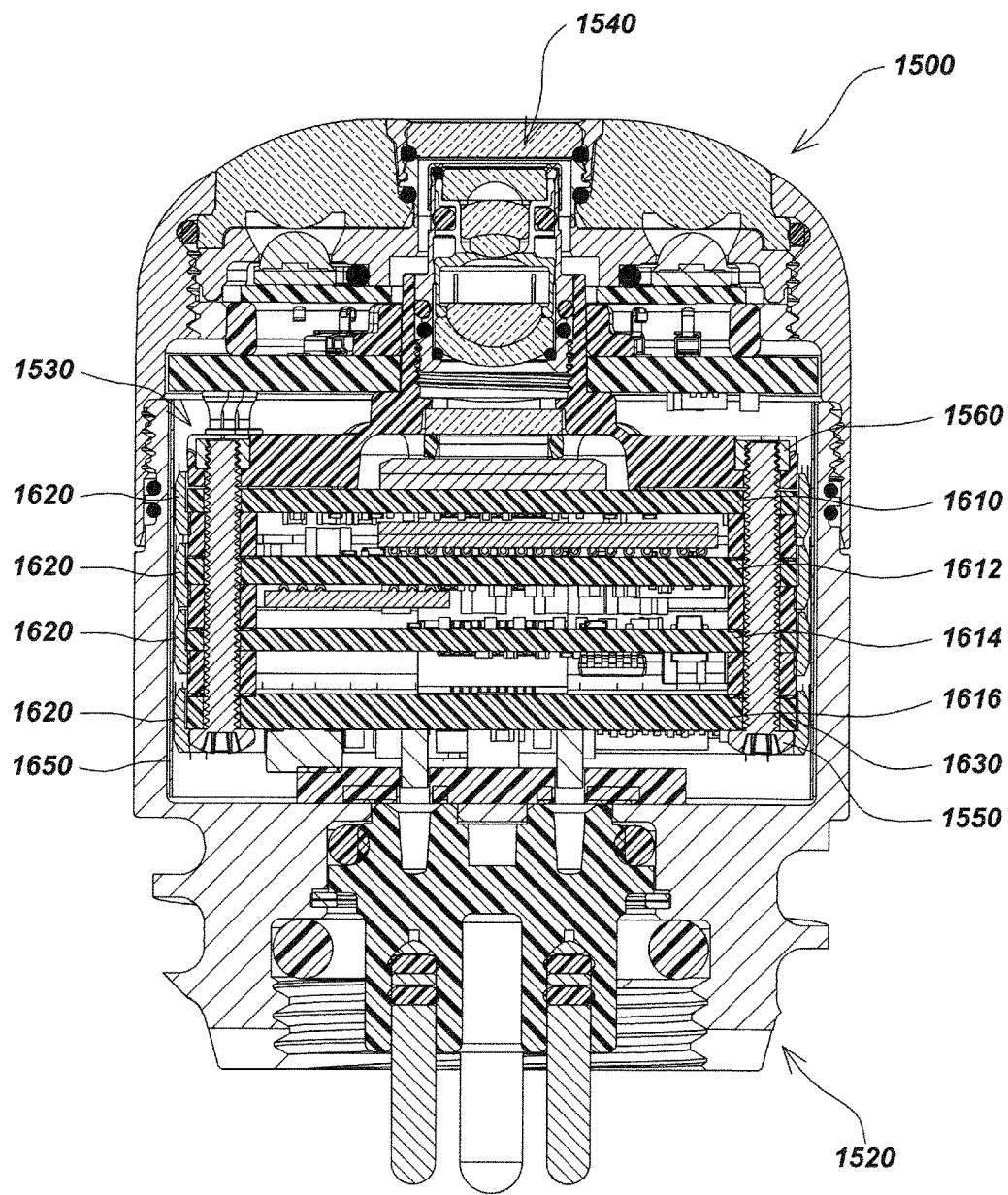
FIG. 18 is a sectional view of the embodiment of FIG. 14 along line 18-18.
Figure 19:
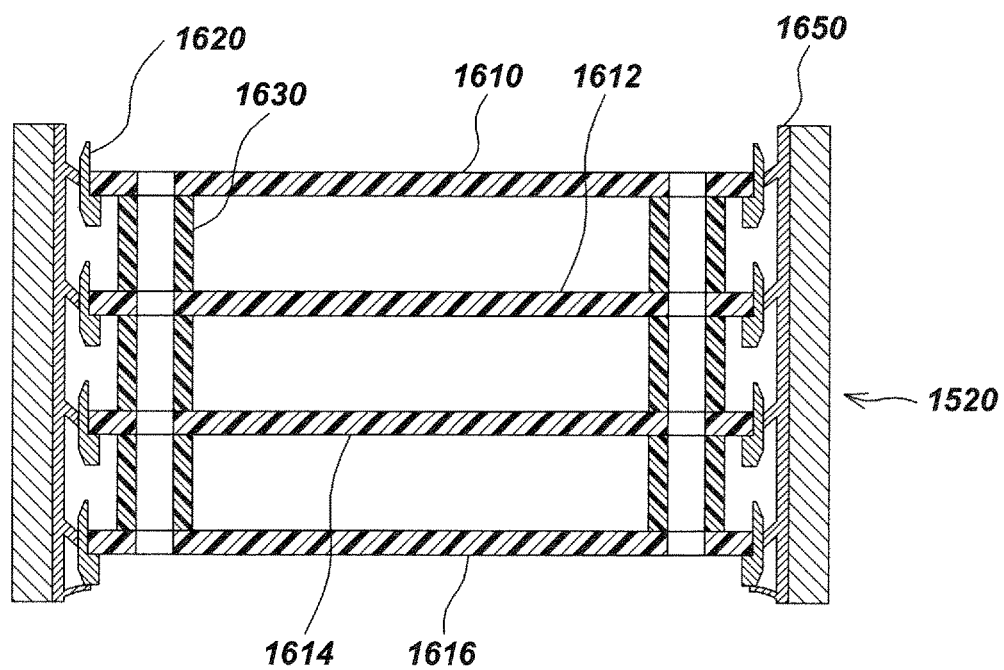
FIG. 19 is an illustration of the arrangement of components within a possible camera head embodiment in keeping with the present disclosure.

The thermal extraction assembly 1530, as best illustrated in FIGS. 16 and 17, may include a series of thermal extraction PCBs 1610-1616, PCB shoes or edge heat transfer rings 1620 dimensioned to be secured about each of the thermal extraction PCBs 1610-1616, a series of PCB spacers 1630, and a thermal extraction element 1650 in a cylindrical shape.

The thermal extraction PCBs 1610-1616 may be designed with heat extracting layers similar to the camera PCBs 810 of FIG. 8. Each of the PCB rings 1620 may include nickel coated aluminum or other highly thermally conductive materials. In assembly, adhesives or solder, such as a low temperature solder, may be used to secure one PCB ring 1620 about each PCB 1610-1616. In use, the PCB shoes 1620 may protect the edges of the PCBs 1610-1616 while still allowing an efficient transfer of heat away from sensitive components on the PCBs 1610-1616. Two PCB spacers 1630 may be positioned between each PCB 1610-1616 such that each PCB spacer may be located above one of two holes formed through each of the PCBs 1610-1616.

Figure 34:
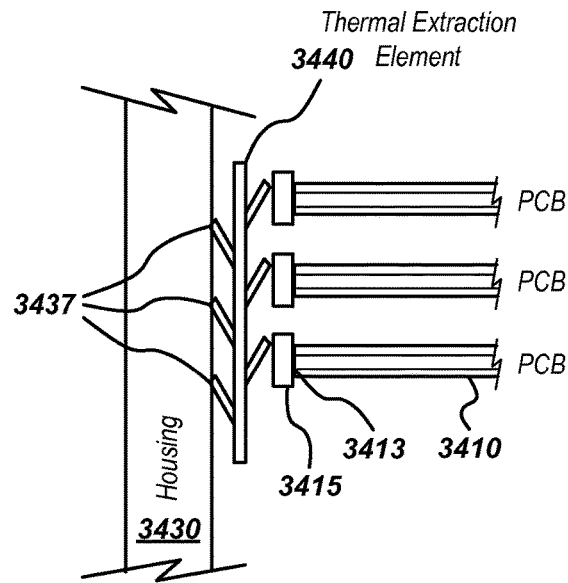

In assembly, the bolts 1550 may be made to pass through the holes formed through the PCBs 1610-1616, through the center of the PCB spacers 1630, through holes formed through the lens assembly 1540, and fasten with nuts 1560. The thermal extraction element 1650 may be of a sheet of brass or other highly thermally conductive material with a series of etched, punched, die-cut, or otherwise formed tabs throughout. As best illustrated best in FIG. 19, when assembled, the thermal transfer element 1650 may be bent or rolled into a cylindrical shape that may be seated within the bottom camera head assembly 1520. The tabs formed throughout the thermal extraction element 1650 may be bent inward and/or outward to provide thermal contact areas. For example, the tabs may be bent inward such that each of the PCB shoes 1620 may contact the tabs on the thermal extraction element 1650. Furthermore, the thermal extraction element 1650 may be dimension such that the outward facing side of the thermal extraction element 1650 may contact the housing of the bottom camera head assembly 1520 allowing heat from components on the PCBs 1610-1616 to be channeled through the thermal extraction PCBs 1610-1616, through the PCB shoes 1620, the thermal extraction element 1650, and to the housing of the bottom camera head assembly 1520, either directly with the thermal extraction element in direct contact with the housing or with outward bent tabs in contact with the housing (e.g., as shown in FIG. 34).

Figure 20:
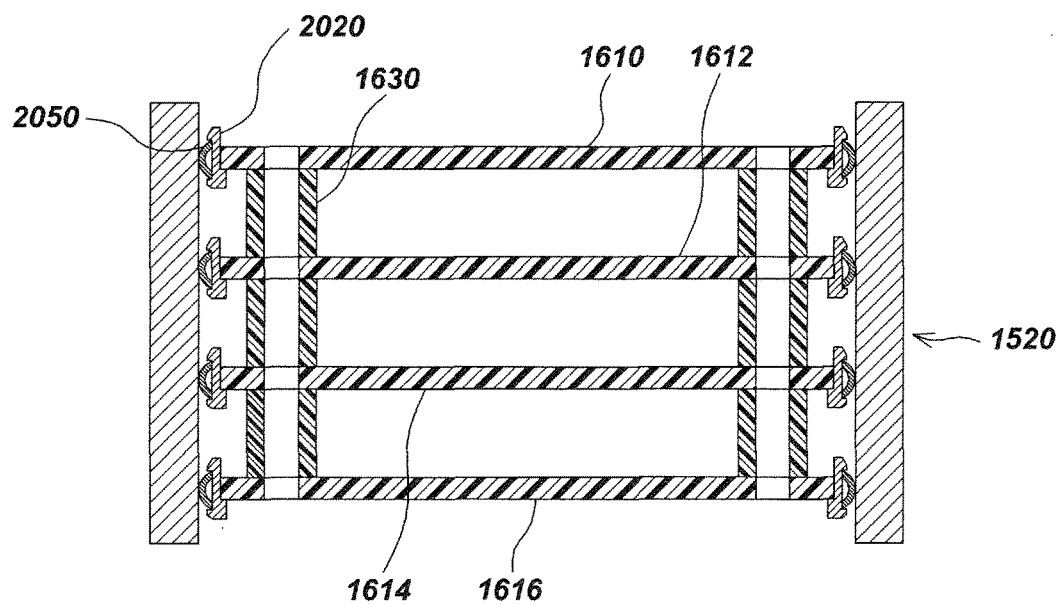
FIG. 20 is an illustration of the arrangement of components within another camera head embodiment in keeping with the present disclosure.

In assembly, a series of bottom tabs on the thermal extraction element 1650 may be formed to act as a stop when the stack of PCBs 1610-1616 is inserted into the housing of the bottom camera head assembly 1520 containing the thermal extraction element 1650. In some embodiments, the singular thermal extraction element 1650 designed to encapsulate the sides of the stack of thermal extraction PCBs 1610-1616 of FIGS. 15-16 may be substituted for multiple thermal extraction elements 2050 as illustrated in FIG. 20. In such embodiments, one thermal extraction element 2020 may be made to secure to each PCB shoe or ring 2020. The PCB shoes or rings 2020 of FIG. 20 may be similar to PCB shoes or rings 1620 of FIGS. 16-19 except with a groove formed along the outside allowing a thermal extraction element 2020 to be secured thereto.

Figure 21:
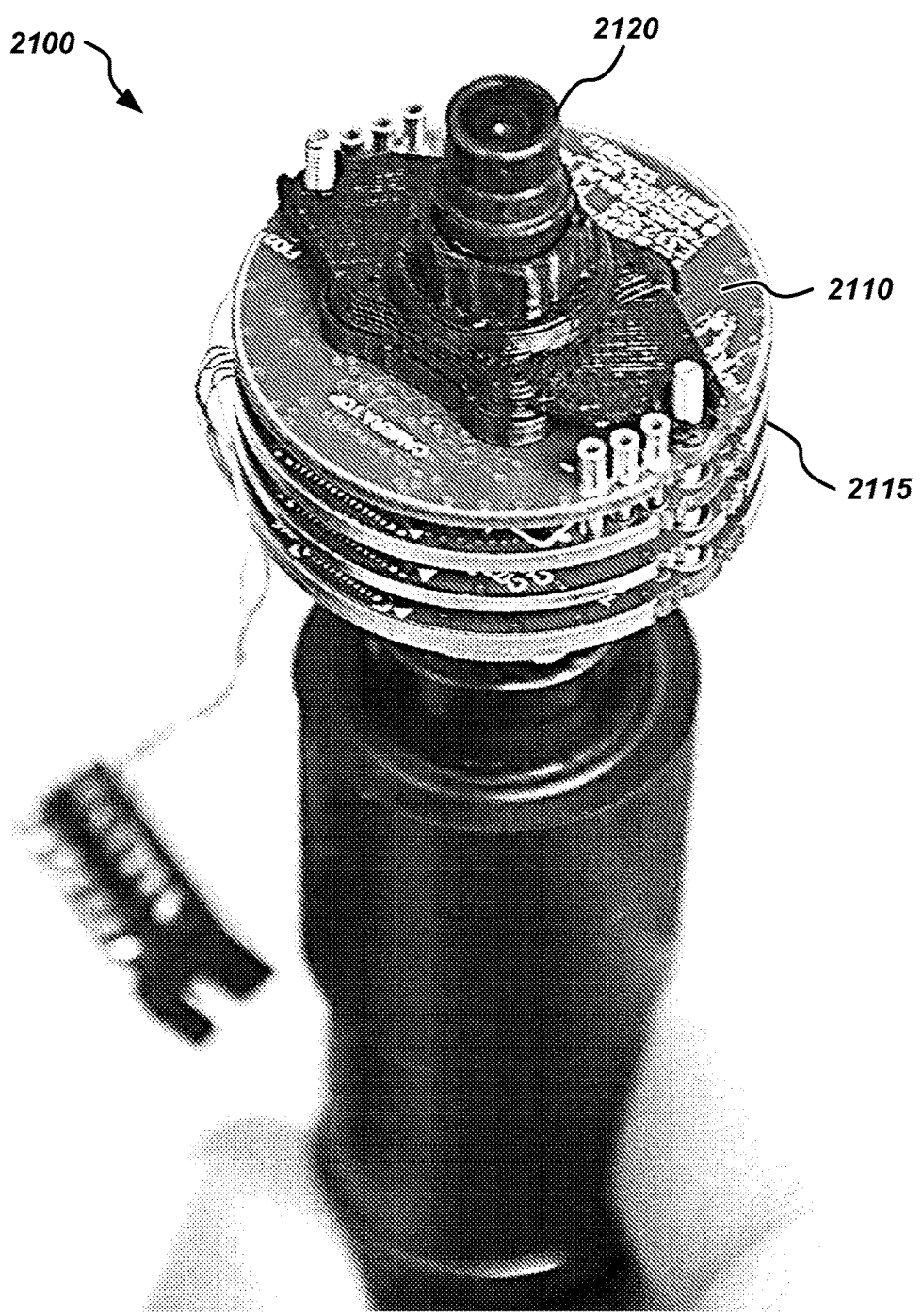
FIG. 21 illustrates an embodiment of camera head electronics and PCBs in accordance with certain aspects.

FIG. 21 illustrates details of an embodiment of camera head electronics 2100 including four stacked PCBs 2110 each having a PCB edge heat transfer ring 2115 to aid in transfer of heat from the edges of the PCBs to thermal extraction elements (not shown). The top PCB includes optical elements 2120 above an onboard imaging sensor mounted on the PCB. Additional PCBs below the top board include additional electronics, processing elements, power supply or control elements, and the like.

Figure 22:
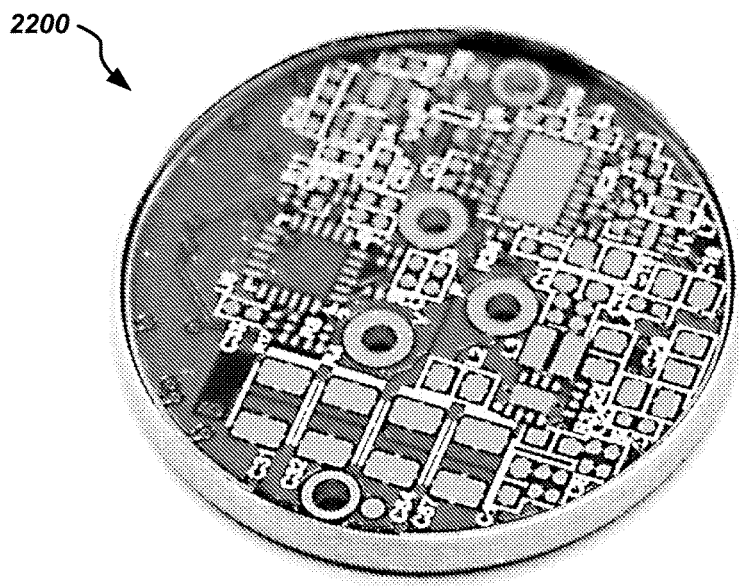
FIGS. 22 and 23 illustrate details of a PCB embodiment with an edge heat transfer ring.
Figure 35:
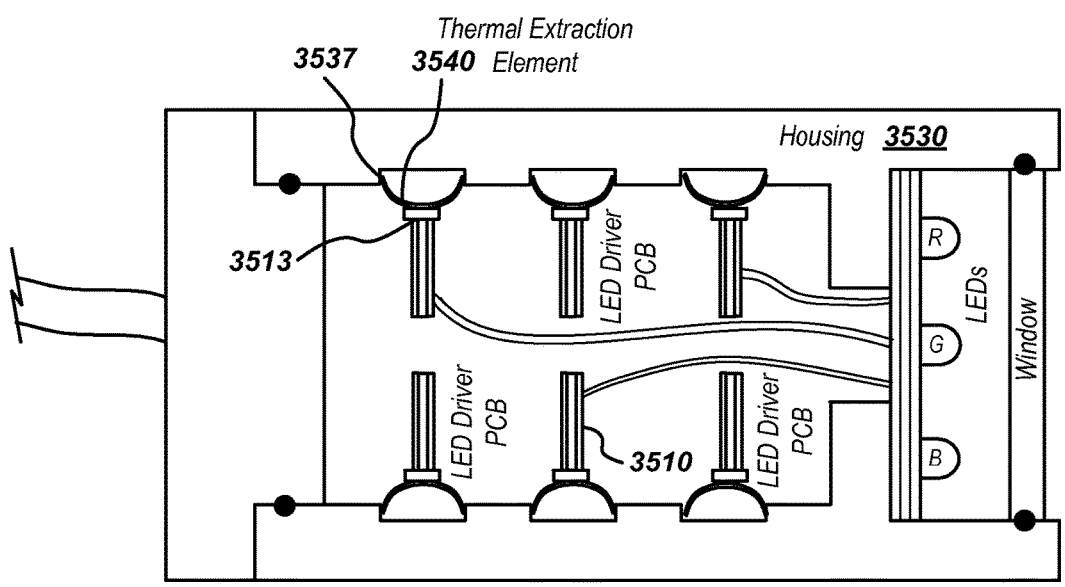
FIG. 35 illustrates details of a lighting device embodiment including a thermal extraction architecture.

FIGS. 22 and 23 illustrate details of an example embodiment of a round PCB assembly 2200 as may be used in a camera head or other device, such as an LED light (e.g., as shown in FIG. 35). PCB assembly 2200 includes a PCB 2210 and an optional PCB edge heat transfer ring 2215 to aid in transferring heat from the PCB edges to adjacent thermal extraction elements (not shown). PCB 2210 may include one or more internal heat conducting layers and heat may be transferred either directly from those layers at the edge of the PCB to the thermal extraction element or may be transferred to the ring 2215 and then to the thermal extraction element. In some embodiments, additional heat transfer structures may be used, such as heat transfer pads or rings on the tops or bottoms of the PCBs in contact with the edges, or other heat transfer structures for directing heat to be removed from the boards to the heat extraction element.

Figure 24:
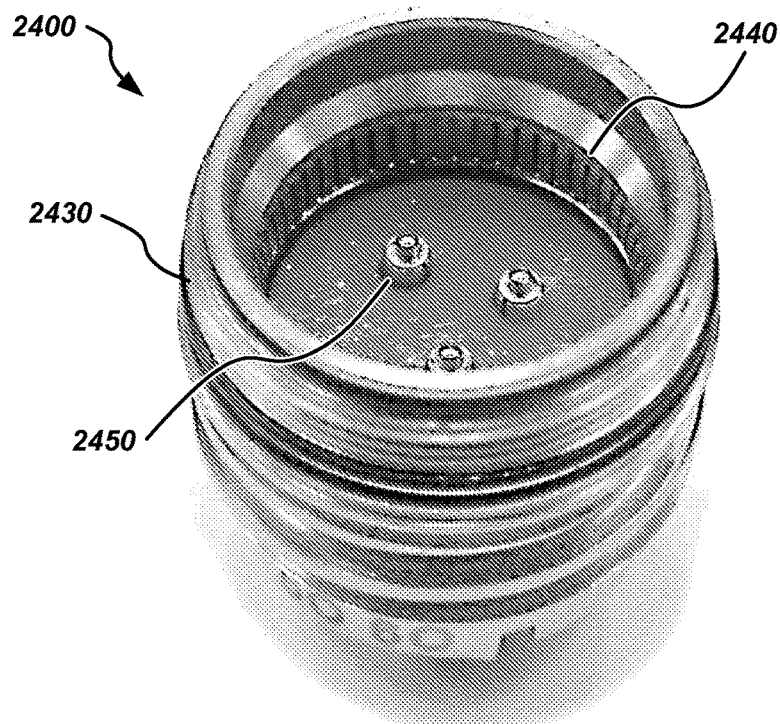
FIGS. 24 and 25 illustrate details of a housing embodiment and an associated thermal extraction element embodiment shown positioned within the housing.

FIGS. 24 and 25 illustrate details of parts of an example camera head embodiment 2400. Camera head 2400 includes a metallic housing 2400, along with an interior circuit board with pins 2450 to provide power and/or signal contacts to additional circuit boards such as those shown in FIGS. 21-23. FIG. 25 illustrates the housing 2430 with a thermal extraction element embodiment 2440 removed, and FIG. 24 illustrates the housing 2430 with the thermal extraction element 2440 installed in the housing in a channel cut into the interior of the housing. When a PCB is placed into the housing as shown in FIG. 24, the PCB edges are in contact with the central contact area of the thermal extraction element, and the lips of the thermal extraction element are in thermal contact with a contact area of the housing (at the edges of the slot or channel) to transfer heat from the thermal extraction element to the housing and then to the exterior environment (e.g., other heat conductors, solids, gases, liquids, etc.).

FIG. 26 illustrates additional details of an exemplary cut toroidal thermal extraction element 2640 with slots to aid in flexing of the thermal extraction element when placed between PCBs and a housing. In addition to aiding in thermal contact through pressure applied on the thermal extraction element by the PCB edges and housing, the flexing configuration of the thermal extraction element may also aid in shock or impact resistance of electronic devices such as cameras, lights, and the like by absorbing some of the energy of impact. For example, video inspection cameras for deployment within buried pipes, such as water or sewer lines, may be subject to impact onto the edge of pipes, or at Ys, Vs, bends in the pipes, or with obstructions such as root growth, pipe breakages, and the like. Including a flexible thermal extraction element such as the cut toroidal element shown in FIGS. 24-26 may aid in shock and impact resistance, especially for devices with sensitive optical and/or electronic components within the housing.

As shown in FIG. 26, in an exemplary camera head embodiment, the camera 2600, including PCB 2615 and associated onboard optics, is approximately the size of a United States nickel coin. Thermal extraction element 2640 is similarly sized in this embodiment.

Figure 27:
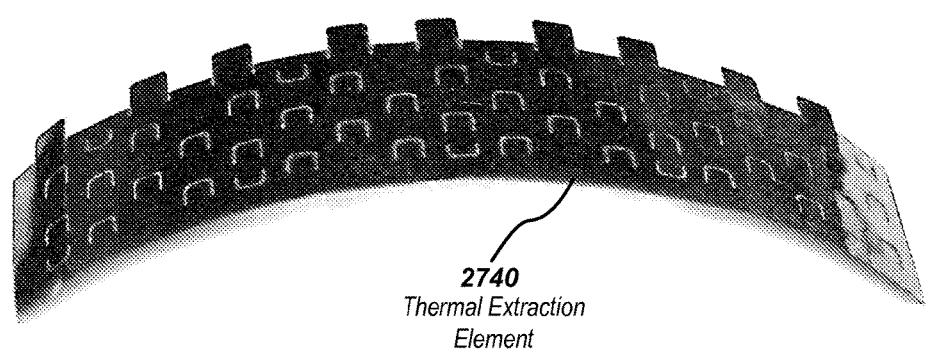
FIG. 27 illustrated details of an alternate thermal extraction element embodiment.

FIG. 27 illustrates another exemplary thermal extraction element embodiment, in this case a tabbed thermal extraction element 2740 in a partially wound configuration. Thermal extraction element 2740 may be further wound in a circle or oval shape such that the ends join, and the punched or die-cut tabs as shown may be bent outward on one or both sides to provide thermal contact areas with an adjacent housing and one or more PCBs.

Although the previously described thermal extraction elements have been primarily illustrated in the form of a cut toroidal configuration where a toroidal shape is cut along a line about the circumference, other shapes may be used in alternate embodiments. FIG. 28 illustrates one camera head configuration in cross-section where the thermal extraction element 2840 is in a cut toroidal shape such as that shown in FIGS. 24-26, with outer lips of the thermal extraction element captured by an edge 2835 of a slot or groove in housing 2830, and the central area of the thermal extraction element 2840 is in thermal contact with a thermal contact area 2813 at the edge of PCB 2810. An optional heat transfer ring 2815, such as shown in FIGS. 22 and 23, may be placed along the edges of the PCB 2810 to aid in heat transfer from the PCB to the thermal extraction element. The lips of thermal extraction element 2840 are in thermal contact with thermal contact area(s) 2837 of housing 2830 to transfer heat from the thermal extraction element to the housing 2830 and then to the exterior of the housing or to another heat sink or heat removal structure.

FIGS. 29-34 illustrate alternate embodiments. For example, FIG. 29 illustrates a cross-sectional view of a combined s-curve shaped thermal extraction element 2940 with outer lips captured by the edges 2935 of housing 2930, where thermal contact areas 2937 of the housing transfer heat from the thermal extraction element to the housing. An optional heat transfer ring 2915, such as shown in FIGS. 22 and 23, may be placed along the edges of the PCB 2910 to aid in heat transfer from the PCB to the thermal extraction element 2940 at thermal contact area 2913.

FIG. 30 illustrates a cross-sectional view of a round or oval shaped thermal extraction element 3040. Housing 3030 may be flat or have a groove or other structure to capture the thermal extraction element. For example, in the configuration shown in FIG. 30, the housing may have a round or oval shaped groove 3035, and the area around the groove 3037 may function as a thermal contact area of the housing in contact with the thermal extraction element. Similar to FIGS. 28 and 29, an optional heat transfer ring 3015, such as shown in FIGS. 22 and 23, may be placed along the edges of the PCB 3010 to aid in heat transfer from the PCB to the thermal extraction element 3040 at thermal contact area 3013.

FIG. 31 illustrates a cross-sectional view of another thermal extraction element embodiment 3140 with a tabbed or rounded outer edge 3140 for contact with thermal transfer areas 3137 of housing 3130, which in this embodiment has a flat surface rather than a groove or slot (However, it is noted that the housing need not be configured this way and may include grooves, slots, rings, or other structures to retain the thermal extraction element within the housing for aiding heat transfer.). An optional heat transfer ring 3115, such as shown in FIGS. 22 and 23, may be placed along the edges of the PCB 3110 to aid in heat transfer from the PCB to the thermal extraction element 3140 at thermal contact area 3113.

FIG. 32 illustrates a cross-sectional view of another thermal extraction element embodiment 3240 with a combined s-curve shaped thermal extraction element 3240 with outer lips captured by a ring or ridge 3235 of housing 3230, where thermal contact areas 3237 of the housing transfer heat from the thermal extraction element to the housing. An optional heat transfer ring 3215, such as shown in FIGS. 22 and 23, may be placed along the edges of the PCB 3210 to aid in heat transfer from the PCB to the thermal extraction element 3240 at thermal contact area 3213.

In some embodiments, one or both contact area edges of the thermal extraction element may be attached or bonded to the housing and/or PCB. For example, as shown in the embodiment of FIG. 33, solder may be used at one or more points 3333 to attach thermal extraction element 3340 to housing 3330 and PCB 3310 and/or ring 3315. This may be done to fix the position of the thermal contact edges of the thermal extraction element and/or to aid in conducting heat outward to the housing at contact areas 3337.

FIG. 35 illustrates details of another embodiment of a device including a thermal extraction architecture, in accordance with aspects disclosed herein, in the form of an LED lighting device 3500. FIG. 35 shows a cut-away cross-sectional view of light 3500, where the internal printed circuit boards 3510 are round-shaped and oriented adjacent to each other in a stacked configuration. Other embodiments may have different PCB shapes and/or orientations, such as square or rectangular-shaped PCBs, oval PCBs, or other PCB shapes or orientations.

Lighting device 3500 includes a housing assembly 3530, which may be comprised of metal or other materials, where at least a portion of the housing is of a heat conductive material. In operation, individual light emitted diodes (LEDs) may be mounted on a printed circuit board or other substrate. In some embodiments the LEDs may be a single color (e.g., blue, white, red, etc.) or, in other embodiments such as shown in FIG. 35, individual LEDs of different colors, such as red (R), green (G), and blue (B) LEDs may be used to provide a particular color output or adjustable color output. One or more LED driver PCBs, such as PCBs 3510 as shown, which may each include power and/or control electronics for the individual LEDs, may be disposed within the housing and may include wiring from the PCBs 3510 to the individual LEDs (e.g., the R, G, and B LEDs shown near the window at the front of the housing.

The PCBs 3510 may be configured similarly to the round PCBs described previously herein, and may include thermal contact areas, such as on the edges, which are in thermal contact with corresponding flexible thermal extraction elements 3540 to transfer heat from the edges of the PCBs 3510 to the housing 3530 and from the housing to the exterior environment. Any of the various thermal extraction element embodiments described previously herein may be used to provide thermal contact between the PCBs 3510, thermal extraction elements 3540, and housing 3530. For example, while a configuration similar to that shown in FIG. 28 is shown in FIG. 35 to transfer heat from each PCB, other configurations, such as those shown in FIGS. 29-34, or others, may be used in alternate embodiments.

The housing 3530 may further include fins, heat sinks, or other structures to enhance thermal transfer to the external environment. Some embodiments of lighting devices in accordance with the aspects illustrated in FIG. 35 may be for use in air or other gaseous environments, whereas other embodiments may be configured in a sealed fashion, such as through use of o-rings or other seals, for underwater or high-pressure environments.

Although the example embodiments described previously herein are illustrated in the context of cameras or lighting devices, similar thermal extraction architectures may be used in other devices where heat transfer from a central or interior area to the device exterior environment may be needed. For example, devices with internal processing elements or other electronics generating significant heat may benefit from a similar architecture by including a thermal extraction element between the electronics' PCB and a housing or other element in thermal contact with the external environment.

In some configurations, the apparatus, circuit, modules, or systems described herein may include means for implementing features or providing functions described herein. In one aspect, the aforementioned means may be a module including a processing element including a processor or processors, associated memory and/or other electronics in which embodiments of the invention reside, such as to implement image or video capture in a camera head, signal processing, switching, data transmission or reception to or from a camera head, or other functions to process and/or condition camera inputs or outputs, lighting device inputs or outputs, or other electronic device inputs or outputs. These may be, for example, modules or apparatus residing in cameras, lighting devices, or other electronic devices or systems including thermal extraction architectures.

In one or more exemplary embodiments, the electronic functions, methods and processes described herein and associated with cameras may be implemented in hardware, software, firmware, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Various functions in embodiments disclosed herein with respect to cameras and other electronic devices may be implemented or performed in one or more processing elements with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c.

The previous description of the disclosed aspects is provided to enable any person skilled in the art to make or use the present disclosure. Various modifications to these aspects will be readily apparent to those skilled in the art, and the generic principles defined herein may be applied to other aspects without departing from the spirit or scope of the disclosure. Thus, the disclosure is not intended to be limited to the aspects shown herein but is to be accorded the widest scope consistent with the appended claims and their equivalents.

We claim:

1. An electronic camera for inspecting hidden or buried utility pipes, comprising:
   an imaging sensor for capturing images or video of an internal area of a pipe in a digital format and storing the images in a non-transitory memory;
   a printed circuit board (PCB) on which the imaging sensor and non-transitory memory is mounted, the PCB including electronics for processing images from the imaging sensor non-transitory memory, the PCB including a thermal extraction area along at least a side of the PCB and a plurality of layers including at least a first thermal extraction layer integral with or coupled to the PCB thermal extraction area, a first electrical connection layer, and a first insulation layer disposed between the first thermal extraction layer and the first electrical connection layer;
   a cylindrical watertight housing assembly for enclosing the PCB, the housing assembly including a transparent window and a housing thermal contact area on the interior of the cylinder; and
   a curved spring loaded thermal extraction element disposed between the PCB and the cylindrical watertight housing assembly element, the thermal extraction element including a first thermal contact area in thermal contact with the PCB thermal extraction area a second thermal contact area in thermal contact with the housing thermal contact area.

2. The electronic camera of claim 1, further comprising one or more light emitted diodes (LEDs) and one or more LED light power circuits disposed on the PCB.

3. The electronic camera of claim 1, wherein the LEDs are of different colors to provide different color outputs.

4. The electronic camera of claim 1, wherein the housing assembly element includes an internal groove to retain the thermal extraction element.

5. The electronic camera of claim 1, wherein the housing assembly element includes a ridge or ring to retain the thermal extraction element.

6. The electronic camera of claim 1, wherein the thermal extraction element is in a cut toroidal shape having upper and lower lips and a mid-section.

7. The electronic camera of claim 6, wherein the upper and/or lower lips are in thermal contact with the housing thermal contact area and the mid-section is in thermal contact with the PCB thermal extraction area.

8. The electronic camera of claim 1, wherein the PCB is a circular or oval PCB.

9. The electronic camera of claim 1, wherein the thermal extraction element is in a cylindrical shape with a plurality of tabs and one or more of the tabs are in thermal contact with the PCB thermal extraction area.

10. The electronic camera of claim 1, further comprising a PCB edge heat transfer ring disposed between the PCB thermal extraction area and the thermal extraction element first contact area.

11. The electronic camera of claim 10, wherein the thermal extraction element is pressed fit in compression and thermally coupled between the PCB edge heat transfer ring and the housing assembly element to transfer heat from the PCB to the housing assembly element.

12. The electronic camera of claim 1, further including one or more additional PCBs having thermal contact between the PCB thermal extraction areas and the thermal extraction element.

13. An electronic camera for inspecting hidden or buried utility pipes, comprising:
   an imaging sensor for capturing images or video of an internal area of a pipe in a digital format and storing the images in a non-transitory memory;
   a substantially circular printed circuit board (PCB) on which the imaging sensor and non-transitory memory is mounted, the PCB including electronics for processing images from the imaging sensor non-transitory memory, the PCB including a thermal extraction area along at least a side of the PCB and a plurality of layers including at least a first thermal extraction layer integral with or coupled to the PCB thermal extraction area, a first electrical connection layer, and a first insulation layer disposed between the first thermal extraction layer and the first electrical connection layer;
   a plurality of light emitted diodes (LEDs) and one or more LED power circuits disposed on the PCB;
   a cylindrical watertight stainless steel housing assembly for enclosing the PCB, the housing assembly including a transparent sapphire window and a housing thermal contact area on the interior of the cylinder; and
   a curved spring loaded thermal extraction element disposed between the PCB and the housing assembly element, the thermal extraction element including a first thermal contact area in thermal contact with the PCB thermal extraction area a second thermal contact area in thermal contact with the housing thermal contact area.

14. The electronic camera of claim 13, wherein the cylindrical watertight stainless steel housing assembly element includes an internal groove to retain the thermal extraction element.

15. The electronic camera of claim 13, wherein the cylindrical watertight stainless steel housing assembly element includes a ridge or ring to retain the thermal extraction element.

16. The electronic camera of claim 13, wherein the thermal extraction element is in a cut toroidal shape having upper and lower lips and a mid-section.

* * * * *